(12) United States Patent
Harada et al.

(10) Patent No.: US 6,844,578 B2
(45) Date of Patent: Jan. 18, 2005

(54) SEMICONDUCTOR INTEGRATED CIRCUIT DEVICE AND MANUFACTURING METHOD THEREFOR

(75) Inventors: Hirofumi Harada, Chiba (JP); Jun Osanai, Chiba (JP)

(73) Assignee: Seiko Instruments Inc., Chiba (JP)

(*) Notice: Subject to any disclaimer, the term of this patent is extended or adjusted under 35 U.S.C. 154(b) by 106 days.

(21) Appl. No.: 10/108,538

(22) Filed: Mar. 27, 2002

(65) Prior Publication Data

US 2002/0158277 A1 Oct. 31, 2002

(30) Foreign Application Priority Data

Mar. 28, 2001 (JP) ........................................ 2001-093839

(51) Int. Cl.[7] .............................................. H01L 29/80
(52) U.S. Cl. ...................... 257/278; 257/242; 257/288; 257/302; 257/329; 257/332; 257/334
(58) Field of Search ................................ 257/288, 332, 257/334, 242, 278, 302, 329

(56) References Cited

U.S. PATENT DOCUMENTS

| | | | |
|---|---|---|---|
| 4,890,144 A | * 12/1989 | Teng et al. | 257/66 |
| 5,285,093 A | * 2/1994 | Lage et al. | 257/332 |
| 5,554,870 A | * 9/1996 | Fitch et al. | 257/334 |
| 5,698,893 A | * 12/1997 | Perera et al. | 257/627 |

* cited by examiner

Primary Examiner—Richard Elms
Assistant Examiner—Doug Menz
(74) Attorney, Agent, or Firm—Adams & Wilks

(57) ABSTRACT

In a semiconductor integrated circuit device in which the number of the PMOS transistors to be used is relatively larger than that of the NMOS transistors and the PMOS transistor is used as an output driver, there is provided a semiconductor integrated circuit device having excellent stability, reliability, and performance while being inexpensive, and a manufacturing method thereof. In such a semiconductor integrated circuit device, complementary MOS circuits are composed of a P-type MOSFET (36) and an N-type MOSFET (37) which are a horizontal, an output driver is composed of a P-type vertical MOSFET (38) having a trench structure, and a conductivity type of the gate electrode of the respective MOSFETs is set as a P-type.

42 Claims, 7 Drawing Sheets

SEMICONDUCTOR INTEGRATED CIRCUIT DEVICE AND MANUFACTURING METHOD THEREFOR

BACKGROUND OF THE INVENTION

1. Field of the Invention

The present invention relates to a semiconductor device composing a semiconductor integrated circuit used for controlling a power source voltage of a portable device or the like and a manufacturing method therefor.

2. Description of the Related Art

FIG. 2 is a schematic cross sectional view of a conventional semiconductor device. This device has a complementary MOS (hereinafter referred to as a CMOS) structure composed of an N-channel MOS (hereinafter referred to as an NMOS) transistor which is formed in a P-type semiconductor substrate and in which a gate electrode is made of $N^+$-type polycrystalline silicon and a P-channel MOS (hereinafter referred to as a PMOS) transistor which is formed in an N-well region and in which a gate electrode is made of $N^+$-type polycrystalline silicon. Generally, a semiconductor integrated circuit device is composed of these MOSFETs.

With respect to the semiconductor device having the above conventional structure, in the case of an enhancement type NMOS (hereinafter referred to as an E-type NMOS) transistor having a standard threshold voltage of about 0.7 V, the gate electrode is made of polycrystalline silicon having an $N^+$-type as a conductivity type. Thus, from a relationship of work functions between the gate electrode and a semiconductor substrate, the channel is a surface channel formed in the surface of the semiconductor substrate. On the other hand, in the case of an enhancement type PMOS (hereinafter referred to as an E-type PMOS) transistor having a standard threshold voltage of about −0.7 V, from a relationship of work functions between the gate electrode made of $N^+$-type polycrystalline silicon and an N-well, the channel becomes a buried channel formed somewhat inside the semiconductor substrate rather than the surface of the semiconductor substrate.

In order to realize low voltage operation, when a threshold voltage is set to be, for example, −0.5 V or more in the buried channel E-type PMOS transistor, a subthreshold characteristic as one index for low voltage operation of the MOS transistor is extremely deteriorated. Thus, a leak current at an off state of the PMOS transistor is increased. As a result, since a consumption current during standby of the semiconductor device is markedly increased, there is a problem in that an application to portable devices represented by a mobile telephone and a personal digital assistant which are said to increase demand in recent years and to further expand the market in the future is difficult. Also, when the channel length of the PMOS transistor is increased to reduce the leak current, drive power of the PMOS transistor is decreased. Thus, in order to supplement the reduced drive power, the channel width of the PMOS transistor is increased by necessity. Therefore, an increase in a chip area and an increase in a cost due to that are caused. This is a serious problem particularly in a semiconductor integrated circuit having the PMOS transistor as an output driver.

On the other hand, as a technical method of making compatibility of low voltage operation and a low consumption current as the above objects, as shown in FIGS. 3 and 4, a so-called homopolar gate technique in which a conductivity type of the gate electrode of an NMOS transistor is made to be an N-type and a conductivity type of the gate electrode of a PMOS transistor is made to be a P-type is generally known. In this case, both an E-type NMOS transistor and an E-type PMOS transistor are surface channel MOS transistors. Thus, even when a threshold voltage is reduced, extreme deterioration of a subthreshold coefficient is not reached and both low voltage operation and low consumption power are possible.

However, there are the following problems in cost and characteristic. That is, with respect to a homopolar gate CMOS structure, the gates in both an NMOS transistor and a PMOS transistor are formed to be different polarities in manufacturing steps. Thus, as compared with a CMOS structure having a gate electrode made of only an $N^+$-polycrystalline silicon monopole, the number of steps is increased and increases in a manufacturing cost and a manufacturing period are caused. Further, with respect to an inverter circuit as a most fundamental circuit element, generally, in order to improve area efficiency, the layout for the gates of the NMOS transistor and the PMOS transistor is made such that a connection through metal is avoided and a piece of polycrystalline silicon which is two-dimensionally continued from the NMOS transistor to the PMOS transistor or a polycide structure composed of a laminate of polycrystalline silicon and high melting metallic silicide is used. However, when the gate is made of polycrystalline silicon as a single layer as shown in FIG. 3, it is impractical because of a high impedance of a PN junction in the polycrystalline silicon. Also, when the gate is made of the polycide structure as shown in FIG. 4, an N-type impurity and a P-type impurity each are diffused respectively to gate electrodes having an inverse conductivity type through the high melting metallic silicide at high speed during thermal treatment in the manufacturing steps. As a result, a work function is changed and a threshold voltage is unstable.

SUMMARY OF THE INVENTION

An object of the present invention is to provide a structure capable of realizing a power management semiconductor device and an analog semiconductor device, in which a low cost, a short manufacturing period, low voltage operation, and low consumption power are possible.

In order to achieve the above-mentioned object, according to the present invention, there is provided a semiconductor integrated circuit device, characterized by comprising: a semiconductor substrate; a horizontal MOS transistor which is formed on the semiconductor substrate and in which a source region and a drain region are located in a horizontal direction; and a vertical MOS transistor which is formed on the semiconductor substrate and in which a source region and a drain region are located in a depth direction, in which a conductivity type of a gate electrode of each of the horizontal MOS transistor and the vertical MOS transistor is a P-type.

Also, there is provided a semiconductor integrated circuit device, characterized in that the P-type gate electrode of each of the horizontal MOS transistor and the vertical MOS transistor is made of first polycrystalline silicon.

Also, there is provided a semiconductor integrated circuit device, characterized in that the P-type gate electrode of each of the horizontal MOS transistor and the vertical MOS transistor has a polycide structure composed of a laminate of first polycrystalline silicon and first high melting metallic silicide.

Also, there is provided a semiconductor integrated circuit device, characterized in that a film thickness of the P-type gate electrode made of the first polycrystalline silicon as a single layer is in a range of 2000 angstroms to 6000 angstroms.

Also, there is provided a semiconductor integrated circuit device, characterized in that the first high melting metallic silicide is one selected from the group consisting of tungsten silicide, molybdenum silicide, titanium silicide, and platinum silicide.

Also, there is provided a semiconductor integrated circuit device, characterized in that the first polycrystalline silicon composing the P-type gate electrode in the horizontal MOS transistor includes one of boron and $BF_2$ at an impurity concentration of $1E18/cm^3$ or higher.

Also, there is provided a semiconductor integrated circuit device, characterized in that the horizontal MOS transistor includes an MOS transistor composed of a low impurity concentration diffusion layer which is two-dimensionally overlapped with the P-type gate electrode and a high impurity concentration diffusion layer which is not two-dimensionally overlapped with the P-type gate electrode.

Also, there is provided a semiconductor integrated circuit device, characterized in that in the horizontal MOS transistor, an impurity concentration of the low impurity concentration diffusion layer is $1E16/cm^3$ to $1E18/cm^3$ and an impurity concentration of the high impurity concentration diffusion layer is $1E19/cm^3$ or higher.

Also, there is provided a semiconductor integrated circuit device, characterized in that in an N-channel MOS transistor of the horizontal MOS transistor, an impurity of the low impurity concentration diffusion layer is one of arsenic and phosphorus and an impurity of the high impurity concentration diffusion layer is one of arsenic and phosphorus.

Also, there is provided a semiconductor integrated circuit device, characterized in that in a P-channel MOS transistor of the horizontal MOS transistor, an impurity of the low impurity concentration diffusion layer is one of boron and $BF_2$ and an impurity of the high impurity concentration diffusion layer is one of boron and $BF_2$.

Also, there is provided a semiconductor integrated circuit device, characterized in that an N-channel MOS transistor of the horizontal MOS transistor includes a first N-channel MOS transistor having a threshold voltage corresponding to a buried channel type and an enhancement type.

Also, there is provided a semiconductor integrated circuit device, characterized in that the N-channel MOS transistor of the horizontal MOS transistor includes a second N-channel MOS transistor having a threshold voltage corresponding to a buried channel type and a depletion type.

Also, there is provided a semiconductor integrated circuit device, characterized in that a P-channel MOS transistor of the horizontal MOS transistor includes a first P-channel MOS transistor having a threshold voltage corresponding to a surface channel type and an enhancement type.

Also, there is provided a semiconductor integrated circuit device, characterized in that the P-channel MOS transistor of the horizontal MOS transistor includes a second P-channel MOS transistor having a threshold voltage corresponding to a buried channel type and a depletion type.

Also, there is provided a semiconductor integrated circuit device, characterized in that the vertical MOS transistor includes:

a concave portion formed from a main surface of the semiconductor substrate;

a gate insulating film covering a side surface and a bottom surface inside the concave portion;

a gate electrode which is contact with the gate insulating film and buried in the concave portion;

a high concentration source region which is located outside the concave portion, in contact with the concave portion, and formed in the surface of the semiconductor substrate;

a body region which is in contact with the concave portion, surrounds the high concentration source region, is formed to be deeper than the high concentration source region and shallower than the inner bottom of the concave portion, and has a conductivity type opposite to the high concentration source region; and a high concentration drain region which is apart from the concave portion, the high concentration source region, and the body region and formed in the main surface of the semiconductor substrate.

There is provided a semiconductor integrated circuit device, characterized in that the gate electrode of the vertical MOS transistor is made of first P-type polycrystalline silicon and first high melting metallic silicide, the first P-type polycrystalline silicon being in contact with the gate insulating film and formed in the concave portion so as to be surrounded by the gate insulating film, and the first high melting metallic silicide being in contact with the first P-type polycrystalline silicon and buried in the concave portion so as to be surrounded by the gate insulating film and the first P-type polycrystalline silicon.

Also, there is provided a semiconductor integrated circuit device, characterized in that the vertical MOS transistor includes:

a concave portion formed from a main surface of the semiconductor substrate;

a gate insulating film covering the main surface of the semiconductor substrate and inner sides and an inner bottom of the concave portion;

a gate electrode which is in contact with the gate insulating film, formed on the main surface of the semiconductor substrate around the concave portion, and buried in the concave portion;

a low concentration source region which is in contact with the concave portion and formed under the gate electrode in the main surface of the semiconductor substrate;

a high concentration source region which is apart from the concave portion, in contact with the low concentration source region, and formed in the main surface of the semiconductor substrate outside the gate electrode;

a body region which is in contact with the concave portion, surrounds the high concentration source region and the low concentration source region, is formed to be deeper than the low concentration source region and the high concentration source region and shallower than the inner bottom of the concave portion, and has a conductivity type opposite to the low concentration source region and the high concentration source region; and a high concentration drain region which is apart from the concave portion, the low concentration source region, the high concentration source region, and the body region and formed in the main surface of the semiconductor substrate.

Also, in the above structure, there is provided a semiconductor integrated circuit device, characterized in that in the vertical MOS transistor, a portion of the gate electrode in the concave portion is made of first P-type polycrystalline silicon and first high melting metallic silicide, the first P-type polycrystalline silicon being in contact with the gate insulating film and formed in the concave portion so as to be surrounded by the gate insulating film, the first high melting metallic silicide being in contact with the first P-type polycrystalline silicon and buried in the concave portion so as to be surrounded by the gate insulating film and the first P-type polycrystalline silicon, and a portion of the gate electrode on the main surface of the semiconductor substrate has a polycide structure composed of a laminate of first polycrystalline silicon and first high melting metallic silicide.

Also, there is provided a semiconductor integrated circuit device, characterized in that an impurity concentration of the low concentration source region in the vertical MOS transistor is $1E18/cm^3$ to $1E19/cm^3$.

Also, there is provided a semiconductor integrated circuit device, characterized in that the vertical MOS transistor is a P-channel type, a conductivity type of the body region is an N-type, and a conductivity type of each of the low concentration source region, the high concentration source region, and the high concentration drain region is a P-type.

Also, there is provided a semiconductor integrated circuit device, characterized in that in the vertical MOS transistor, an impurity of the body region is one of P and As, a concentration of the impurity thereof is $1E16/cm^3$ to $5E17/cm^3$, a depth thereof is 0.5 $\mu$m to 3 $\mu$m, an impurity of each of the high concentration source region and the high concentration drain region is one of B and $BF_2$, and a concentration of the impurity thereof is $1E20/cm^3$ or higher.

Also, there is provided a semiconductor integrated circuit device, characterized in that the vertical MOS transistor is formed in a P-type well layer formed in the main surface of the semiconductor substrate.

Also, there is provided a semiconductor integrated circuit device, characterized in that an impurity concentration in the P-type well layer is $1E16/cm^3$ to $1E17/cm^3$.

Also, there is provided a semiconductor integrated circuit device, characterized in that the vertical MOS transistor is formed on a P-type buried layer formed in an inner portion of the semiconductor substrate.

Also, there is provided a semiconductor integrated circuit device, characterized in that an impurity concentration in the P-type buried layer is $1E18/cm^3$ or higher.

Also, there is provided a semiconductor integrated circuit device, characterized in that an impurity concentration in the P-type buried layer is $1E20/cm^3$ or higher.

Also, there is provided a semiconductor integrated circuit device, characterized in that the vertical MOS transistor is formed on the P-type buried layer formed in the inner portion of the semiconductor substrate and the P-type buried layer is surrounded by an N-type buried layer and an N-type well layer which are formed in the inner portion of the semiconductor substrate.

Also, there is provided a semiconductor integrated circuit device, characterized in that the vertical MOS transistor is formed on the P-type buried layer formed in the inner portion of the semiconductor substrate and the P-type buried layer is in contact with the P-type well layer.

Also, there is provided a semiconductor integrated circuit device, characterized in that a conductivity type of the semiconductor substrate is an N-type.

Also, there is provided a semiconductor integrated circuit device, characterized in that the horizontal MOS transistor and the vertical MOS transistor are formed in an N-type epitaxial layer formed on the P-type semiconductor substrate.

Also, there is provided a semiconductor integrated circuit device, characterized in that an impurity concentration in the P-type semiconductor substrate is $1E18/cm^3$ or higher.

Also, there is provided a semiconductor integrated circuit device, characterized in that the horizontal MOS transistor is formed on an N-type buried layer formed in the inner portion of the semiconductor substrate.

Also, there is provided a semiconductor integrated circuit device, characterized in that a drain electrode of the vertical MOS transistor is formed on a rear surface of the P-type semiconductor substrate.

Also, according to the above technique, there is provided a semiconductor integrated circuit device, characterized in that the semiconductor integrated circuit device includes an error amplifier, a reference voltage circuit, a PMOS transistor output element, a voltage dividing circuit composed of a resistor, an input terminal, and an output terminal, and characterized in that a source electrode of the PMOS transistor output element is connected with the input terminal, a drain electrode of the PMOS transistor output element is connected with the output terminal, an output voltage outputted from the output terminal is divided by the voltage dividing circuit, the divided voltage and a reference voltage outputted from the reference voltage circuit are inputted to the error amplifier to compare the inputted voltages, and a voltage amplified according to a difference between the voltages is outputted from the error amplifier to be inputted to a gate electrode of the PMOS transistor output element.

Also, according to the above technique, there is provided a semiconductor integrated circuit device, characterized in that the semiconductor integrated circuit device includes an error amplifier, a reference voltage circuit, a PMOS transistor switch, a voltage dividing circuit composed of a resistor, an oscillating circuit, a PWM (pulse width modulation) control circuit, an input terminal, and an output terminal, and characterized in that an output voltage outputted from the output terminal is divided by the voltage dividing circuit, the divided voltage and a reference voltage outputted from the reference voltage circuit are inputted to the error amplifier to compare the inputted voltages, a voltage amplified by the error amplifier according to a difference between the voltages and a voltage outputted from the oscillating circuit are inputted to the PWM control circuit, a voltage outputted from the PWM control circuit is inputted to a gate electrode of the PMOS transistor switch in which a source electrode is connected with the input terminal, and a drain electrode of the PMOS transistor switch is used as a signal terminal.

Also, in order to achieve the above-mentioned object, as a first method, there is provided a method of manufacturing a semiconductor integrated circuit device, characterized by comprising:

a P-type buried layer forming step of forming a P-type buried layer in a region which is located in a surface of an N-type semiconductor substrate and in which a P-type vertical MOS transistor is to be formed;

an N-type epitaxial growth layer forming step of forming an N-type epitaxial growth layer on the N-type semiconductor substrate;

a P-type well layer forming step of forming P-type well layers in regions which are located in the N-type epitaxial growth layer and in which an N-type horizontal MOS transistor and the P-type vertical MOS transistor are to be formed;

a body region forming step of forming an N-type body region in the region which is located in the N-type epitaxial growth layer and in which the P-type vertical MOS transistor is to be formed;

a trench forming step of performing anisotropic etching toward an inner portion of the N-type semiconductor substrate up to a depth that a trench does not reach the P-type buried layer to form the trench in the region which is located in the N-type epitaxial growth layer and in which the P-type vertical MOS transistor is to be formed;

a gate insulating film forming step of forming a gate insulating film along a surface of the N-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type epitaxial growth layer in the trench;

a low concentration N-type region forming step of introducing an N-type impurity in a self-alignment manner using as a mask a gate electrode located on the N-type epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the N-type epitaxial growth layer and in a region in which a P-type horizontal MOS transistor is to be formed, to thereby form a low concentration P-type impurity region;

an N-type source-drain region forming step of introducing an N-type impurity into a region on the N-type epitaxial growth layer in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the N-type epitaxial growth layer in which the P-type horizontal MOS transistor is to be formed, which is located at a predetermined distance apart from the gate electrode and a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes in the horizontal MOS transistors and the vertical MOS transistor; and a metallic electrode forming step of forming metallic electrodes which are connected with the gate electrodes and the source and drain regions through the contact holes.

As a second method, there is provided a method of manufacturing a semiconductor integrated circuit device, characterized by comprising:

a P-type well layer forming step of forming P-type well layers in regions which are located on a surface of an N-type semiconductor substrate and in which an N-type horizontal MOS transistor and a P-type vertical MOS transistor are to be formed;

a body region forming step of forming an N-type body region in the region which is located on the N-type semiconductor substrate and in which the P-type vertical MOS transistor is to be formed;

a trench forming step of performing anisotropic etching toward an inner portion of the N-type semiconductor substrate up to a depth that a trench does not exceed a depth of the P-type well layer to form the trench in the region which is located on the N-type semiconductor substrate and in which the P-type vertical MOS transistor is to be formed;

a gate insulating film forming step of forming a gate insulating film along the surface of the N-type semiconductor substrate and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type semiconductor substrate and in the trench;

a low concentration N-type region forming step of introducing an N-type impurity in a self-alignment manner using as a mask a gate electrode located on the N-type semiconductor substrate and in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the N-type semiconductor substrate and in a region in which a P-type horizontal MOS transistor is to be formed, to thereby form a low concentration P-type impurity region;

an N-type source-drain region forming step of introducing an N-type impurity into a region on the N-type semiconductor substrate in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the N-type semiconductor substrate in which the P-type horizontal MOS transistor is to be formed, which is located at a predetermined distance apart from the gate electrode and a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes in the horizontal MOS transistors and the vertical MOS transistor; and a metallic electrode forming step of forming metallic electrodes which are connected with the gate electrodes and the source and drain regions through the contact holes.

As a third method, there is provided a method of manufacturing a semiconductor integrated circuit device, characterized by comprising:

a P-type buried layer forming step of forming a P-type buried layer in a region which is located in a surface of an N-type semiconductor substrate and in which a P-type vertical MOS transistor is to be formed;

an N-type buried layer forming step of forming N-type buried layers in regions which are located in the surface of the N-type semiconductor substrate and in which horizontal MOS transistors are to be formed;

a P-type epitaxial growth layer forming step of forming a P-type epitaxial growth layer on the N-type semiconductor substrate;

an N-type well layer forming step of forming N-type well layers up to a depth that the N-type well layers reach the N-type buried layer in a vicinity of a region in which a P-type horizontal MOS transistor is to be formed, a vicinity of a region in which an N-type horizontal MOS transistor is to be formed, and a vicinity of the region in which the P-type vertical MOS transistor is to be formed, the regions being located in the P-type epitaxial growth layer;

a body region forming step of forming an N-type body region in the region which is located in the P-type epitaxial growth layer and in which the P-type vertical MOS transistor is to be formed;

a trench forming step of performing anisotropic etching toward an inner portion of the N-type semiconductor substrate up to a depth that a trench does not reach the P-type buried layer to form the trench in the region which is located in the P-type epitaxial growth layer and in which the P-type vertical MOS transistor is to be formed;

a gate insulating film forming step of forming a gate insulating film along a surface of the P-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the P-type epitaxial growth layer in the trench;

a low concentration N-type region forming step of introducing an N-type impurity in a self-alignment manner using as a mask a gate electrode located on the P-type epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the P-type epitaxial growth layer in the region in which the P-type horizontal MOS transistor is to be formed, to thereby form a low concentration P-type impurity region;

an N-type source-drain region forming step of introducing an N-type impurity into a region on the P-type epitaxial growth layer in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the P-type epitaxial growth layer in which the P-type horizontal MOS transistor is to be formed, which is located at a predetermined distance apart from the gate electrode and a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes in the horizontal MOS transistors and the vertical MOS transistor; and a metallic electrode forming step of forming metallic electrodes which are connected with the gate electrodes and the source and drain regions through the contact holes.

As a fourth method, there is provided a method of manufacturing a semiconductor integrated circuit device, characterized by comprising:

an N-type buried layer forming step of forming N-type buried layers in regions which are located in a surface of a high concentration P-type semiconductor substrate and in which horizontal MOS transistors are to be formed;

an N-type epitaxial growth layer forming step of forming an N-type epitaxial growth layer on the high concentration P-type semiconductor substrate;

a P-type well layer forming step of forming P-type well layers in regions which are located in the N-type epitaxial growth layer and in which an N-type horizontal MOS transistor and a P-type vertical MOS transistor are to be formed, the P-type well layer in the region in which the P-type vertical MOS transistor are to be formed being formed up to a depth such that the P-type well layer reaches the high concentration P-type semiconductor substrate;

an N-type well layer forming step of forming N-type well layers in the region in which the P-type horizontal MOS transistor is to be formed and in a vicinity of the region in which the P-type vertical MOS transistor is to be formed up to a depth such that the N-type well layers reach the N-type buried layer, the regions being located in the P-type epitaxial growth layer;

a body region forming step of forming an N-type body region in the region which is located in the N-type epitaxial growth layer and in which the P-type vertical MOS transistor is to be formed;

a trench forming step of performing anisotropic etching toward an inner portion of the semiconductor substrate up to a depth such as not to reach the high concentration P-type semiconductor substrate, to thereby form a trench in the region which is located in the N-type epitaxial growth layer and in which the P-type vertical MOS transistor is to be formed;

a gate insulating film forming step of forming a gate insulating film along a surface of the N-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type epitaxial growth layer in the trench;

a low concentration N-type region forming step of introducing an N-type impurity in a self-alignment manner using as a mask a gate electrode located on the epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the epitaxial growth layer in a region in which the P-type horizontal MOS transistor is to be formed, to thereby form a low concentration P-type impurity region;

an N-type source-drain region forming step of introducing an N-type impurity into a region on the N-type epitaxial growth layer in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the N-type epitaxial growth layer and in which the P-type horizontal MOS transistor is to be formed, which is located at a predetermined distance apart from the gate electrode, and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions of the horizontal MOS transistors, in the intermediate insulating film located on a source region of the P-type vertical MOS transistor, and in metallic electrode forming regions of the gate electrodes;

a metallic electrode forming step of forming metallic electrodes in the gate electrodes and the source and drain regions through the contact holes; and a vertical MOS transistor drain metallic electrode forming step of forming a drain metallic electrode of the P-type vertical MOS transistor on a rear surface of the high concentration P-type semiconductor substrate.

As a fifth method, there is provided a method of manufacturing a semiconductor integrated circuit device, characterized by comprising:

a P-type buried layer forming step of forming a P-type buried layer in a region which is located in a surface of an N-type semiconductor substrate and in which a P-type vertical MOS transistor is to be formed;

an N-type epitaxial growth layer forming step of forming an N-type epitaxial growth layer on the N-type semiconductor substrate;

a P-type well layer forming step of forming P-type well layers in regions which are located in the N-type epitaxial growth layer and in which an N-type horizontal MOS transistor and the P-type vertical MOS transistor are to be formed;

a body region forming step of forming an N-type body region in the region which is located in the N-type epitaxial growth layer and in which the P-type vertical MOS transistor is to be formed;

a P-type low concentration source region forming step of forming a P-type low concentration source region in the region which is located in the N-type epitaxial growth layer and in which the P-type vertical MOS transistor is to be formed;

a trench forming step of performing anisotropic etching toward an inner portion of the semiconductor substrate up to a depth that a trench does not reach the P-type buried layer, to thereby form a trench in the region which is located in the N-type epitaxial growth layer and in which the P-type vertical MOS transistor is to be formed;

a gate insulating film forming step of forming a gate insulating film along a surface of the N-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type epitaxial growth layer in the trench;

a low concentration N-type region forming step of introducing an N-type impurity in a self-alignment manner using as a mask a gate electrode located on the epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the epitaxial growth layer in a region in which a P-type horizontal MOS transistor is to be formed, to thereby form a low concentration P-type impurity region;

an N-type source-drain region forming step of introducing an N-type impurity into a region on the N-type epitaxial growth layer in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the N-type epitaxial growth layer in which the P-type horizontal MOS transistor is to be formed, which is located at a predetermined distance apart from the gate electrode, and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes in the horizontal MOS transistors and the P-type vertical MOS transistor; and a metallic electrode forming step of forming metallic electrodes in the gate electrodes and the source and drain regions through the contact holes.

As a sixth method, there is provided a method of manufacturing a semiconductor integrated circuit device, characterized by comprising:

a P-type well layer forming step of forming P-type well layers in regions which are located on a surface of an N-type semiconductor substrate and in which an N-type horizontal MOS transistor and a P-type vertical MOS transistor are to be formed;

a body region forming step of forming an N-type body region in the region which is located on the semiconductor substrate and in which the P-type vertical MOS transistor is to be formed;

a P-type low concentration source region forming step of forming a P-type low concentration source region in the region which is located on the semiconductor substrate and in which the P-type vertical MOS transistor is to be formed;

a trench forming step of performing anisotropic etching toward an inner portion of the semiconductor substrate up to a depth not exceeding a depth of the P-type well layer, to thereby form the trench in the region which is located on the N-type semiconductor substrate and in which the P-type vertical MOS transistor is to be formed;

a gate insulating film forming step of forming a gate insulating film along the surface of the semiconductor substrate and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the semiconductor substrate and in the trench;

a low concentration N-type region forming step of introducing an N-type impurity in a self-alignment manner using as a mask a gate electrode located on the semiconductor substrate in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the semiconductor substrate in a region in which a P-type horizontal MOS transistor is to be formed, to thereby form a low concentration P-type impurity region;

an N-type source-drain region forming step of introducing an N-type impurity into a region on the N-type semiconductor substrate, in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the N-type semiconductor substrate in which the P-type horizontal MOS transistor is to be formed, which is located at a predetermined distance apart from the gate electrode, and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes in the horizontal MOS transistors and the P-type vertical MOS transistor; and a metallic electrode forming step of forming metallic electrodes which are connected with the gate electrodes and the source and drain regions through the contact holes.

As a seventh method, there is provided a method of manufacturing a semiconductor integrated circuit device, characterized by comprising:

a P-type well layer forming step of forming P-type well layers in regions which are located on a surface of an N-type semiconductor substrate and in which an N-type horizontal MOS transistor and a P-type vertical MOS transistor are to be formed;

a body region forming step of forming an N-type body region in the region which is located on the semiconductor substrate and in which the P-type vertical MOS transistor is to be formed;

a P-type low concentration source region forming step of forming a P-type low concentration source region in the region which is located on the semiconductor substrate and in which the P-type vertical MOS transistor is to be formed;

a trench forming step of performing anisotropic etching toward an inner portion of the semiconductor substrate up to a depth not exceeding a depth of the P-type well layer, to thereby form the trench in the region which is located on the N-type semiconductor substrate and in which the P-type vertical MOS transistor is to be formed;

a gate insulating film forming step of forming a gate insulating film along the surface of the semiconductor substrate and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the semiconductor substrate and in the trench;

a low concentration N-type region forming step of introducing an N-type impurity in a self-alignment manner using as a mask a gate electrode located on the semiconductor substrate in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the semiconductor substrate in a region in which a P-type horizontal MOS transistor is to be formed, to thereby form a low concentration P-type impurity region;

an N-type source-drain region forming step of introducing an N-type impurity into a region on the N-type semiconductor substrate, in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the N-type semiconductor substrate in which the P-type horizontal MOS transistor is to be formed, which is located at a predetermined distance apart from the gate electrode, and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes in the horizontal MOS transistors and the P-type vertical MOS transistor; and a metallic electrode forming step of forming metallic electrodes which are connected with the gate electrodes and the source and drain regions through the contact holes.

As an eighth method, there is provided a method of manufacturing a semiconductor integrated circuit device, characterized by comprising:

an N-type buried layer forming step of forming N-type buried layers in regions which are located in a surface of a high concentration P-type semiconductor substrate and in which horizontal MOS transistors are to be formed;

an N-type epitaxial growth layer forming step of forming an N-type epitaxial growth layer on the high concentration P-type semiconductor substrate;

a P-type well layer forming step of forming P-type well layers in regions which are located in the N-type epitaxial growth layer and in which an N-type horizontal MOS transistor and a P-type vertical MOS transistor are to be formed, up to a depth at which the P-type well layer reaches the high concentration P-type semiconductor substrate in the region in which a P-type vertical MOS transistor is to be formed;

an N-type well layer forming step of forming N-type well layers up to a depth at which the N-type well layers reach the N-type buried layer in the region in which the P-type horizontal MOS transistor is to be formed and in a vicinity of the region in which the P-type vertical MOS transistor is to be formed, the regions being located in the N-type epitaxial growth layer;

a body region forming step of forming an N-type body region in the region which is located in the N-type epitaxial growth layer and in which the P-type vertical MOS transistor is to be formed;

a P-type low concentration source region forming step of forming a P-type low concentration source region in the region which is located in the N-type epitaxial growth layer and in which the P-type vertical MOS transistor is to be formed;

a trench forming step of performing anisotropic etching toward an inner portion of the high concentration P-type semiconductor substrate up to a depth at which a trench does not reach the high concentration P-type semiconductor substrate to form the trench in the region which is located in the N-type epitaxial growth layer and in which the P-type vertical MOS transistor is to be formed;

a gate insulating film forming step of forming a gate insulating film along a surface of the N-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type epitaxial growth layer in the trench;

a low concentration N-type region forming step of introducing an N-type impurity in a self-alignment manner using as a mask a gate electrode located on the N-type epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the N-type epitaxial growth layer in a region in which the P-type horizontal MOS transistor is to be formed, to thereby form a low concentration P-type impurity region;

an N-type source-drain region forming step of introducing an N-type impurity into a region on the epitaxial growth layer in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the epitaxial growth layer and in which the P-type horizontal MOS transistor is to be formed, which is located at a predetermined distance apart from the gate electrode, and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions of the horizontal MOS transistors, in the intermediate insulating film located on a source region of the P-type vertical MOS transistor, and in metallic electrode forming regions of the gate electrodes;

a metallic electrode forming step of forming metallic electrodes in the gate electrodes and the source and drain regions through the contact holes; and a vertical MOS transistor drain metallic electrode forming step of forming a drain metallic electrode of the P-type vertical MOS transistor on a rear surface of the high concentration P-type semiconductor substrate.

Further, in the above first to eighth methods, a P-type polycrystalline silicon layer forming step of depositing the polycrystalline silicon layer on the gate insulating film while adding a P-type impurity gas is performed.

Further, in the above first to eighth methods, instead of the P-type polycrystalline silicon layer forming step of depositing the polycrystalline silicon layer on the gate insulating film and implanting the P-type impurity into the polycrystalline silicon layer by the ion implantation method, a P-type polycrystalline silicon layer forming step of depositing the polycrystalline silicon layer on the gate insulating film while adding a P-type impurity gas is performed.

Alternatively, a P-type polycrystalline silicon forming step of depositing the polycrystalline silicon layer on the gate insulating film, implanting the P-type impurity into the polycrystalline silicon layer by the ion implantation method, and depositing high melting metallic silicide on the polycrystalline silicon layer is performed.

Alternatively, a P-type polycrystalline silicon layer forming step of depositing the polycrystalline silicon layer on the gate insulating film while adding a P-type impurity gas and depositing high melting metallic silicide on the polycrystalline silicon layer is performed.

DETAILED DESCRIPTION OF THE PREFERRED EMBODIMENTS

Figure 1:
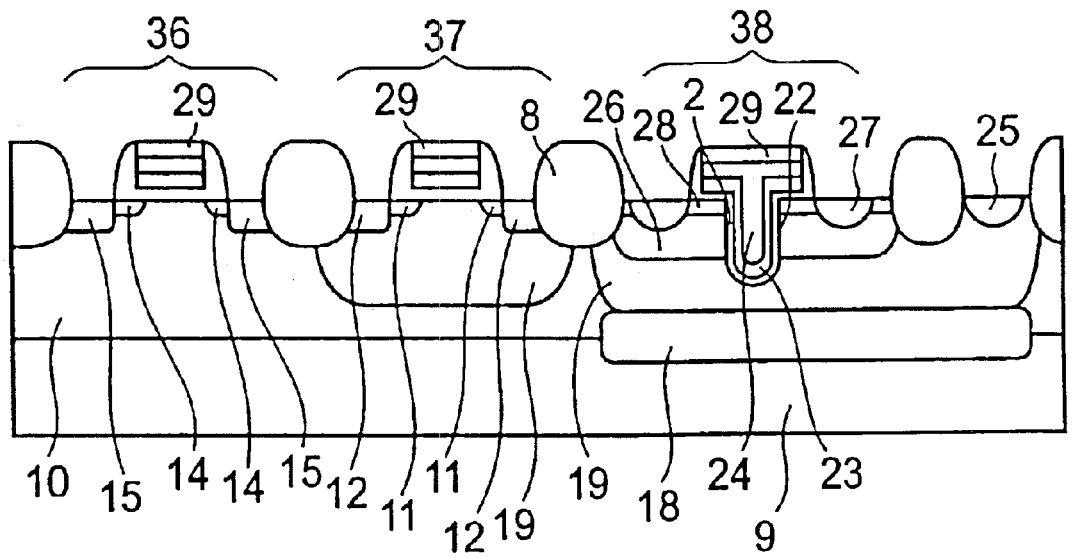
FIG. 1 is a schematic cross sectional view of a semiconductor integrated circuit device in accordance with an embodiment of the present invention.
Figure 2:
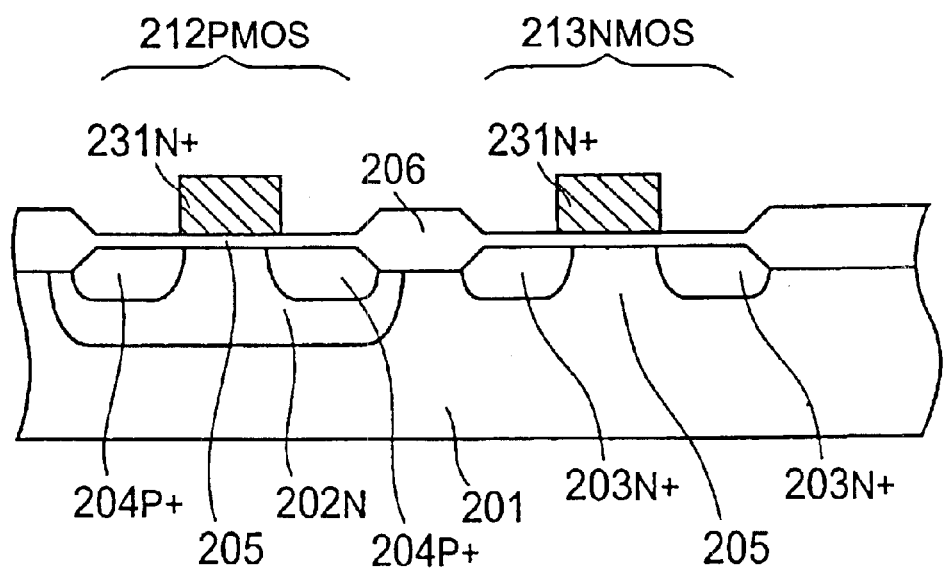
FIG. 2 is a schematic cross sectional view indicating a method of manufacturing a conventional semiconductor integrated circuit device.
Figure 3:
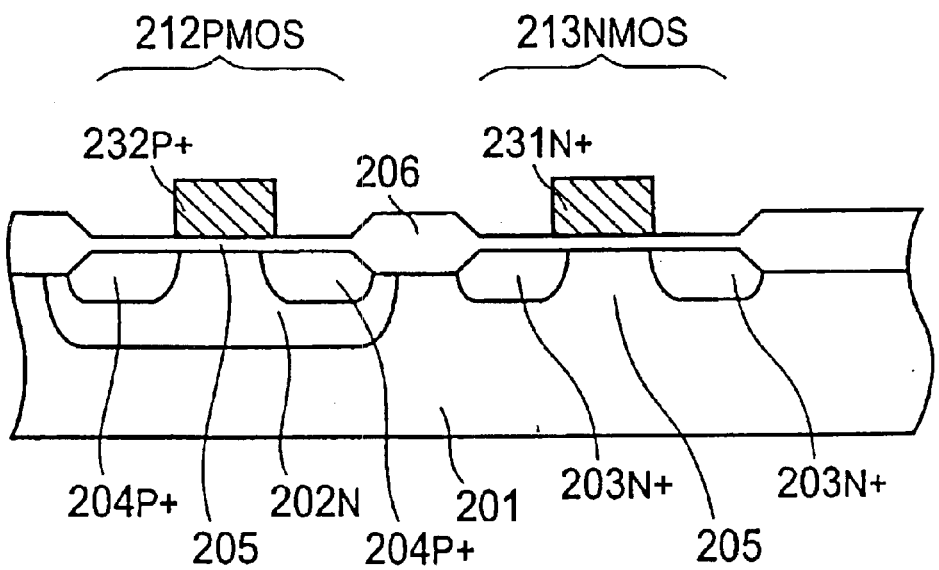
FIG. 3 is a schematic cross sectional view indicating a structure of the conventional semiconductor integrated circuit device.
Figure 4:
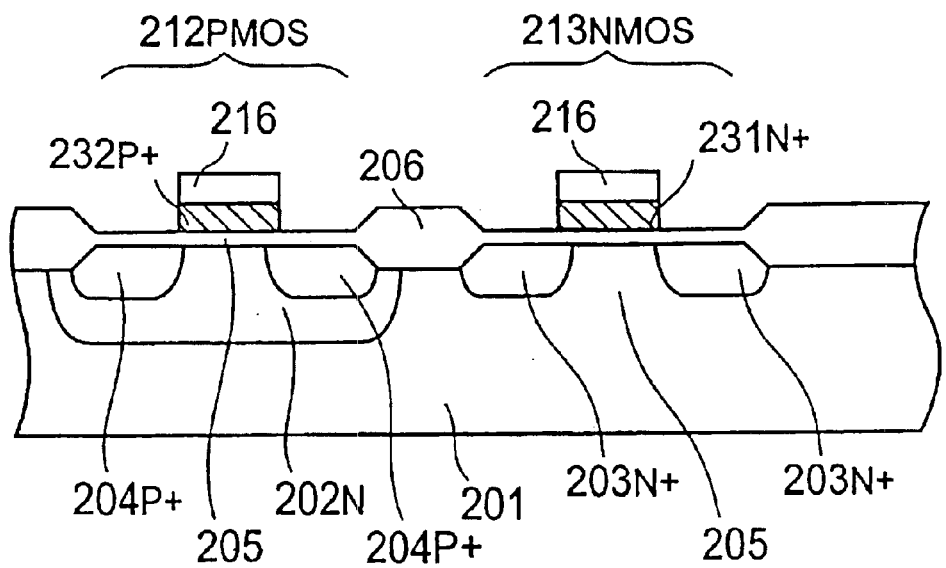
FIG. 4 is a schematic cross sectional view indicating a structure of the conventional semiconductor integrated circuit device.

According to the present invention, in a semiconductor integrated circuit device in which the number of the PMOS transistors to be used is relatively larger than that of the NMOS transistors and the PMOS transistor is used as an output driver, a buried channel MOSFET is used as the NMOS transistor, a surface channel MOSFET is used as the PMOS transistor, and the output driver is composed of a P-type vertical MOSFET. Thus, improvement of the drive power and miniaturization are promoted.

Also, when a buried channel which is not suitable for a short channel is applied to the NMOS transistor, it is a disadvantage for only the NMOS transistor. However, when the comparison with the performance of a conventional buried channel PMOS transistor is made, the drive power can be greatly improved as compared with a conventional case. This is because, even if the N-type transistor and the P-type transistor have an identical channel length, an electron as a carrier of the NMOS transistor has a larger mobility than a hole as a carrier of the PMOS transistor.

Also, when a minimum channel length of the NMOS transistor is determined, there is the case where such a length is not necessarily determined by a short channel effect. This is the case where bipolar operation (snap-back phenomenon) due to a substrate current of the NMOS transistor is caused. This is because a drain current and a drain electric field are increased with a short channel and generation of a hot carrier is promoted. On the other hand, since the number of generations of hot carriers in the PMOS transistor is extremely smaller than in the N-type, there is almost no case where the channel length is determined by the snap-back phenomenon. In other words, in the case of an application such as the present invention, it is opposite to common sense with respect to miniaturization and a short channel is easy to obtain in the PMOS transistor rather than the NMOS transistor. From such a viewpoint, in the case of a semiconductor integrated circuit device in which the number of the PMOS transistors to be used is relatively larger than that of the NMOS transistors and the PMOS transistor is used as an output driver, it is very effective that a surface channel is used for the PMOS transistor of the present invention, the output driver is composed of a P-type vertical MOSFET, and a buried channel is used for the NMOS transistor.

Further, the number of generations of hot carriers in the NMOS transistor is smaller in the buried channel rather than the surface channel. When a limitation of a short channel of the NMOS transistor is not determined by a leak current, this becomes a factor capable of breaking through the limitation of the short channel due to the snap-back phenomenon. In other words, in this case, the short channel of the NMOS transistor can be also promoted.

Further, according to a manufacturing method of the present invention, when an N-type impurity is implanted using P-type polysilicon as a mask, an increase in a resistance and depletion of a gate electrode due to a reduction in a concentration of the P-type polysilicon are concerned. In order to solve such a problem, a method of forming a metallic silicide film on the P-type polysilicon, forming an oxide film thereon, and etching the P-type polysilicon, the metallic silicide film, and the oxide film using the same mask to leave the oxide film until a predetermined step is performed. According to this method, when an N-type impurity is implanted using P-type polysilicon as a mask, it is possible that the implantation of the N-type impurity into the P-type polysilicon is prevented.

Hereinafter, an embodiment of the present invention will be described based on the drawings. In this embodiment, the case where the present invention is applied to an MOSFET formed on a single crystal semiconductor substrate will be described. FIG. 1 shows a cross sectional structure of a first embodiment of the present invention. A semiconductor integrated circuit of the present invention includes a PMOS transistor having a P-type gate electrode, an NMOS transistor having a P-type gate electrode, and a vertical PMOS transistor having a P-type gate electrode.

In FIG. 1, an N-type epitaxial layer 10 is formed on an N-type semiconductor substrate 9 and further a P-type buried layer 18 and a P-type well layer 19 are formed thereon. Although a PMOS transistor 36 is formed on the N-type epitaxial layer 10, the gate electrode thereof has a laminate structure of P-type polysilicon and a metallic silicide film. Thus, a surface channel type is realized in an enhancement type PMOS transistor.

Also, although an NMOS transistor 37 is formed on the P-type well layer 19, the gate electrode thereof has a laminate structure of P-type polysilicon and a metallic silicide film as the above. Thus, a buried channel type is realized in an enhancement type NMOS transistor.

However, when a depletion type NMOS transistor and a depletion type PMOS transistor are produced by impurity implantation into the channel regions, each of them becomes a buried channel type. In each of these MOSFETs, the source includes a low concentration source region and a high concentration source region and the drain includes a low concentration drain region and a high concentration drain region. Each of these regions has a conductivity type according to a polarity of the respective MOSFETs. For example, in the case of the PMOS transistor, P$^-$-type impurity regions 14 and P$^+$-type impurity regions 15 are formed.

Further, a P-type vertical MOSFET 38 is formed on the P-type buried layer 18 and the P-type well layer 19. The vertical MOSFET has a structure in which side walls of a concave portion (referred to as a trench) 22 produced by etching the P-type well layer by a predetermined depth are used for the channel and is generally called a UMOS transistor. A gate insulating film 2 is formed in an inner wall of the trench 22 and then P-type polycrystalline silicon 23 is deposited on the gate insulating film to such an extent that the trench is not completely buried. Further, a metallic silicide film 24 is formed on the polycrystalline silicon 23 such that the trench is completely buried. Thus, flattening of the trench portion is realized simultaneous with taking of a polycide structure. An N-type body region 26 is inverted through the gate insulating film 2 located on the side walls of the trench 22 by a gate electrode composed of the P-type polycrystalline silicon 23 and the metallic silicide film 24 to produce the channel. In the case of the P-type vertical MOSFET 38, a current is caused to flow from the surface of the substrate through a P-type high concentration drain region 25 provided in the surface of the substrate. The current passes a path from the P-type well layer 19 and the P-type buried layer 18 which function as drains to a P-type high concentration source region 27 located in the surface of the substrate through the channel region.

Figure 8:
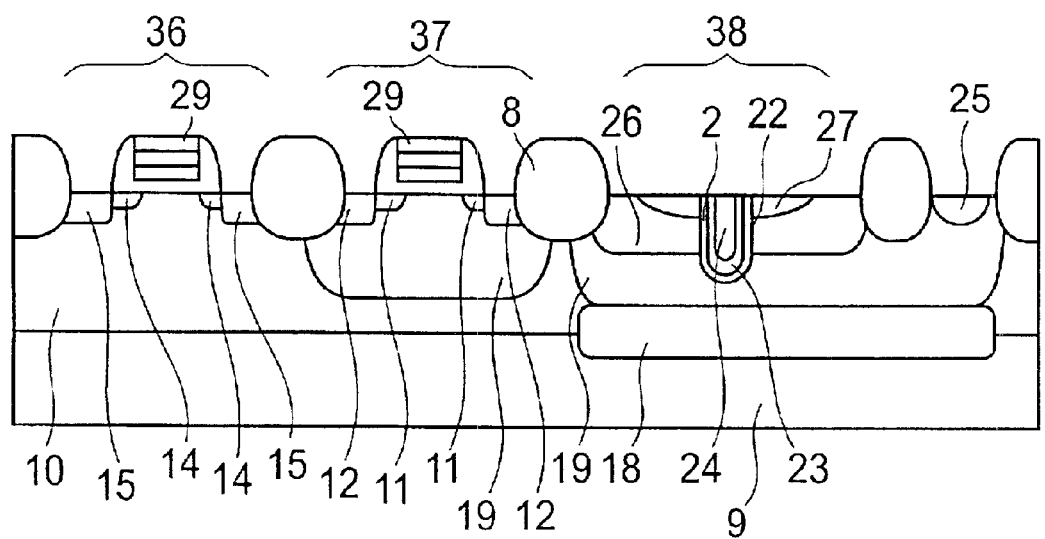
FIG. 8 is a schematic cross sectional view of a semiconductor integrated circuit device in accordance with another embodiment of the present invention.

The P-type vertical MOSFET 38 may be structured as shown in FIG. 8. In FIG. 1, the structure in which the gate electrode is protruded from the trench portion in the P-type vertical MOSFET is indicated. On the other hand, in FIG. 8, a structure in which a gate electrode is not protruded from the trench portion by etching the gate electrode without forming a mask on the trench portion is indicated. With respect to the latter, there is a possibility that variations in a characteristic are caused in the case where excess etching is made at the formation of the gate electrode. On the other hand, with respect to the former, there is an advantage that the characteristic is not influenced by variations in such an etching process. Conversely, with respect to the latter, there is an advantage that an element area is reduced. Since the number of steps is the same in both structures, either structure is selected according to controllability of a process. However, when the gate electrode structure shown in FIG. 1 is selected, in order to prevent that the top end corner portions of the trench 22 become the channel portion, a P-type low concentration source region 28 is formed under the gate electrode protruded from the surface.

Here, the NMOS transistor 37 formed in the P-type well layer is separated from the PMOS transistor 36 formed on the N-type epitaxial layer by a PN junction separation. Also, the P-type vertical MOSFET 38 is separated from the NMOS transistor 37 by a PN junction separation through the P-type buried layer and the P-type well layer. Thus, there is no case where operations of respective elements are influenced by potentials and currents. Since the drain electrode in the P-type vertical MOSFET 38 is provided in the surface of the substrate, a terminal is led from the surface of the substrate as in the case of a general semiconductor integrated circuit and no limitation is particularly made in packaging.

Also, an NSG used for ion implantation protection and gate electrode patterning is formed on the gate electrode of the respective MOSFETs. However, when the structure in which the gate electrode is not protruded from the trench portion in the P-type vertical MOSFET 38 is used as shown in FIG. 8, the NSG is not required on the gate electrode.

Figure 5:
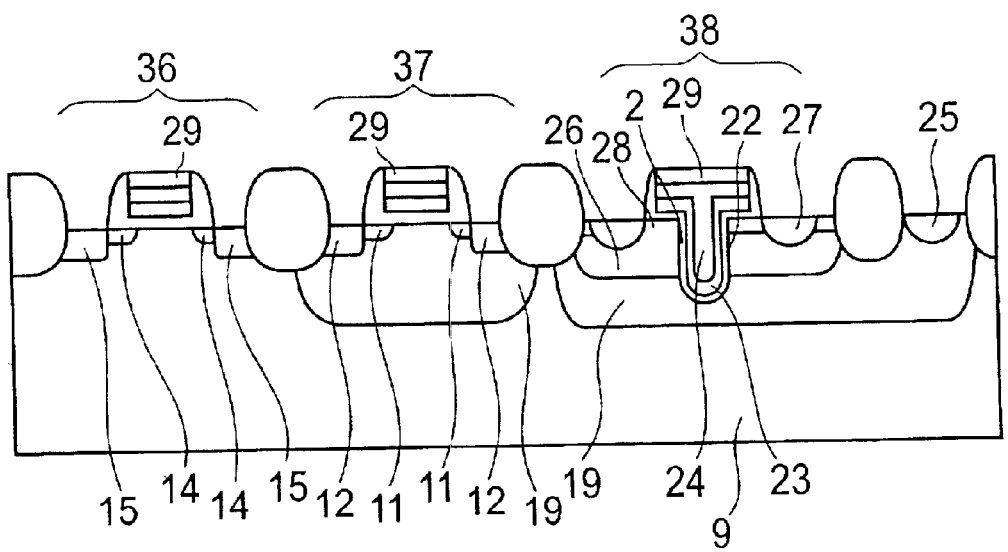
FIG. 5 is a schematic cross sectional view of a semiconductor integrated circuit device in accordance with another embodiment of the present invention.

FIG. 5 shows another embodiment of the present invention. In FIG. 5, a structure in which the P-type buried layer is not formed under the P-type vertical MOSFET is indicated. As compared with the structure shown in FIG. 1, a drain resistance in the P-type vertical MOSFET is high. On the other hand, a step of forming an N-type epitaxial layer and a step of forming a P-type buried layer can be omitted and a reduction in a process cost can be realized. When an area occupied by a PMOS transistor output driver circuit in a semiconductor integrated circuit may be relatively small, this embodiment is used. When the structure shown in FIG. 5 is used in the case where an area of the output driver is large, a reduction in drive power due to an increase in a drain resistance cannot be neglected. As a result, in order to supplement the reduced drive power, it is necessary to increase a channel width. Thus, the area of the output driver becomes larger and it is impractical. In other words, when the area of the output driver may be small in such a manner that an effect of the buried layer to the drain resistance can be neglected, a reduction in a process cost can be achieved by using the structure shown in FIG. 5.

Figure 6:
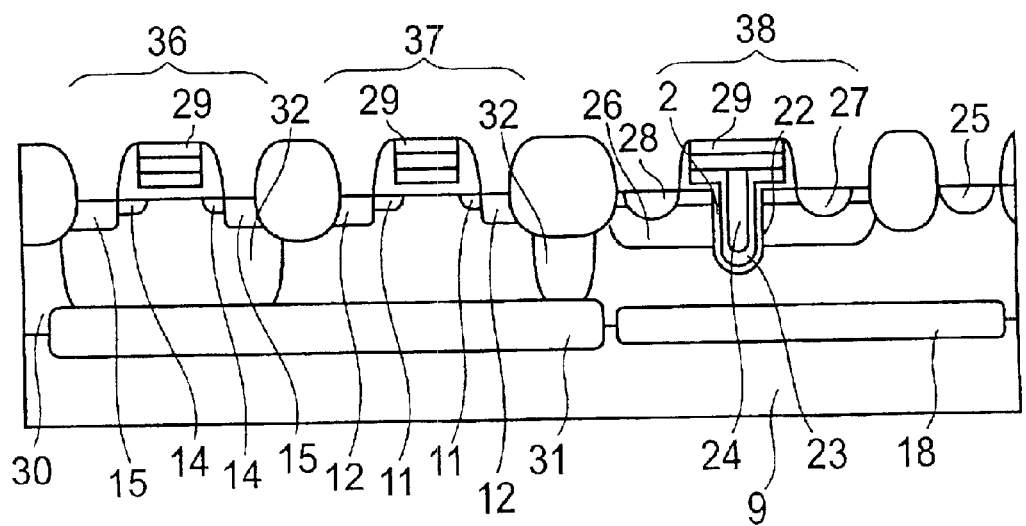
FIG. 6 is a schematic cross sectional view of a semiconductor integrated circuit device in accordance with another embodiment of the present invention.

Further, FIG. 6 shows another embodiment of the present invention. As shown in FIG. 6, a P-type epitaxial layer 30 is formed on an N-type semiconductor substrate 9. An NMOS transistor 37 is formed on the P-type epitaxial layer 30 located on an N-type buried layer 31. A PMOS transistor 36 is formed on an N-type well layer 32 formed on the N-type buried layer 31. A P-type vertical MOSFET 38 is formed on the P-type epitaxial layer 30 located on a P-type buried layer 18.

When such a structure is used, since impurity concentrations of low concentration drains in the P-type vertical MOSFET can be further reduced, a high resistance to voltage can be realized. Also, since an impurity concentration of an N-type body region 26 can be similarly reduced, a low threshold voltage is possible. Isolation between elements is made by the N-type buried layer 31 and the N-type well layer 32. If the N-type well layer 32 can be formed up to a sufficiently deep location such that it reaches the N-type semiconductor substrate 9 and isolation between respective elements is possible by only the N-type well layer 32, the N-type buried layer 31 may be omitted from the structure shown in FIG. 6. When an area of an output driver composed of the P-type vertical MOSFET may be small, the P-type buried layer 18 can be also omitted. Thus, it is also possible to give priority to reduction in a process cost.

Figure 7:
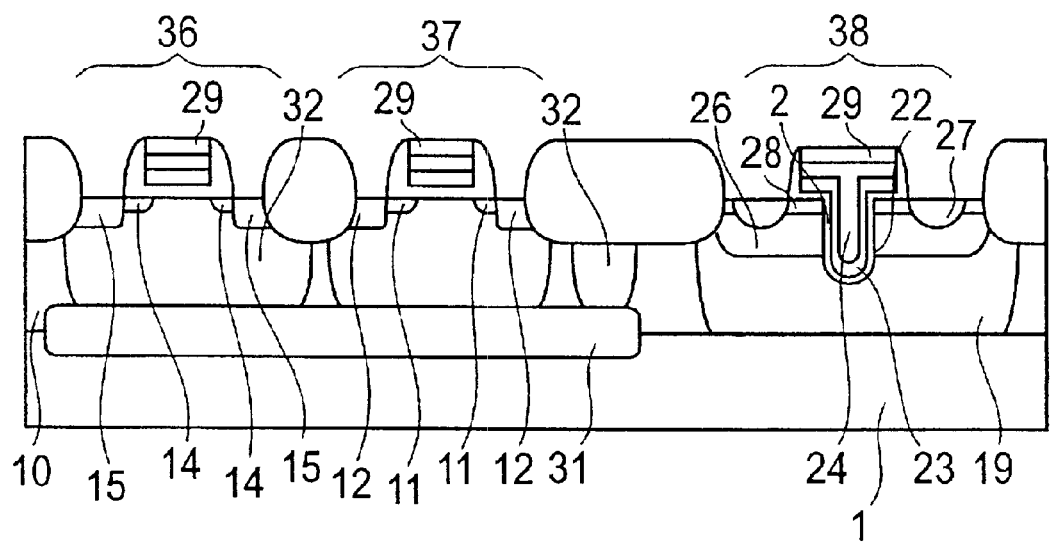
FIG. 7 is a schematic cross sectional view of a semiconductor integrated circuit device in accordance with another embodiment of the present invention.

Further, FIG. 7 shows another embodiment of the present invention. The drain electrode of the P-type vertical MOSFET is formed in the surface in FIGS. 1, 5, and 6. However, when a P-type semiconductor substrate having a high concentration is used as shown in FIG. 7, a drain electrode of a P-type vertical MOSFET 38 can be led from the rear surface of the substrate. Thus, a further reduction in an area of an output driver can be realized. In this case, an N-type epitaxial layer 10 is formed on a P-type semiconductor substrate 1 having a high concentration, into which boron (B) is implanted at $1E18/cm^3$ or higher. A PMOS transistor 36 and an NMOS transistor 37 are formed over an N-type buried layer. Further, the PMOS transistor 36 is located on an N-type well layer 32 and the NMOS transistor 37 is located on a P-type well layer 19 if necessary. The N-type buried layer and the N-type well layer are also used for isolation between elements. The P-type well layer is formed such that it reaches the P-type semiconductor substrate 1 having the high concentration and also used as a low concentration drain in the P-type vertical MOSFET 38. Although not shown, metal is formed on the entire rear surface and is used for a drain electrode of the P-type vertical MOSFET 38.

When an output driver is large, that is, when a large output current is required, it is necessary to increase a wiring width correspondingly. Also, particularly on a semiconductor integrated circuit, isolation between such a large wiring and another wiring in a layout is extremely complicated. In such a case, it is very effective to apply this structure of the present invention.

Next, one example of a manufacturing method of the present invention will be described based on FIGS. 11 to 16. First, the N-type semiconductor substrate 9 is prepared and a P-type buried layer which becomes a drain of the P-type vertical MOSFET 38 later is formed. In the case of ion implantation, the P-type buried layer is produced by implantation at a dose of the order of $1E14/cm^2$ in consideration of the influence of defect. Annealing for recovering a defect due to the ion implantation is performed at 1000° C. or higher for 1 hour or longer. An impurity concentration is made to be the order of $1E18/cm^2$ by this method. When it is required that a drain resistance of P-type vertical MOSFET is minimized as much as possible, an impurity is implanted at a high concentration by thermal diffusion so that the concentration is made to be the order of $1E20/cm^3$. The P-type buried layer is effective to reduce the drain resistance of the P-type vertical MOSFET. However, when the drive power and the area of the P-type vertical MOSFET are small, there is the case where it is sufficient if only a P-type well layer as described later is formed. In this case, the step of forming the P-type buried layer and a next step of forming an N-type epitaxial layer can be omitted.

Figure 11:
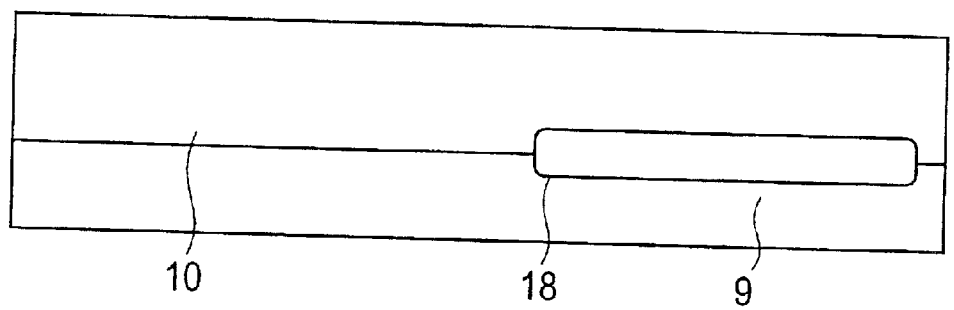
FIG. 11 is a schematic cross sectional view indicating a method of manufacturing the semiconductor integrated circuit device of the present invention.

Next, an N-type epitaxial layer is formed on the N-type semiconductor substrate 9. A thickness and an impurity concentration of the N-type epitaxial layer are determined by desirable performances of a semiconductor integrated circuit to be manufactured, such as a withstand voltage and a drive current of an MOSFET. However, the concentration is about the order of $1E15/cm^3$, the thickness is several $\mu$m to over 10 $\mu$m (FIG. 11).

Next, a P-type well layer is formed in the N-type epitaxial layer and in a region in which an NMOS transistor and the P-type vertical MOSFET are formed. At this time, by boron impurity implantation and high temperature thermal treatment, the P-type well layer has a surface concentration of the order of $1E16/cm^3$ and is formed up to a deep location such that it reaches the P-type buried layer. The P-type well layer may also serves as a P-type well layer required for a region in which the NMOS transistor is formed or may be formed only for the P-type vertical MOSFET by preparing another mask. When it is formed by using another mask, the P-type well layer corresponding to the characteristic of the P-type vertical MOSFET can be obtained. For example, this P-type well layer may be formed to have a higher impurity concentration and a deeper diffusion depth than the P-type well layer required for the region in which the NMOS transistor is formed. In particular, in the case of the P-type vertical MOSFET, the P-type well layer functions as a low concentration drain. Thus, in order to improve drive power, there is the case where an increase in a concentration is desired. A preferable surface concentration of the P-type well layer in the P-type vertical MOSFET is $1E16/cm^3$ to $1E17/cm^3$.

Figure 12:
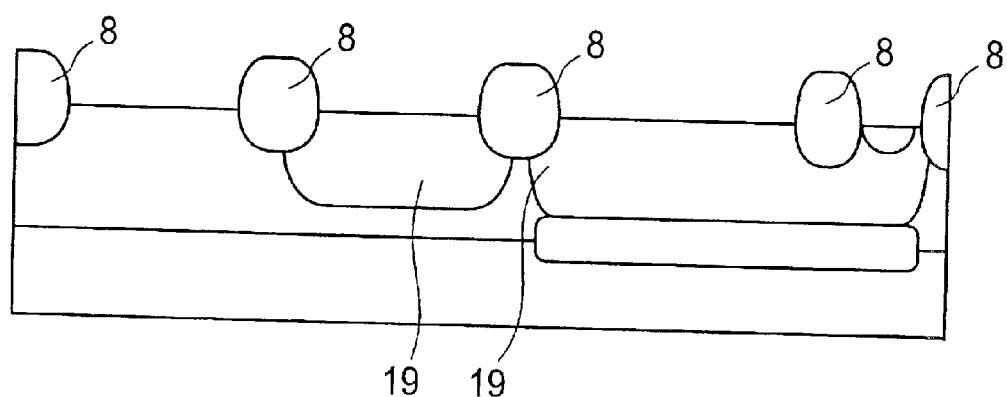
FIG. 12 is a schematic cross sectional view indicating the method of manufacturing the semiconductor integrated circuit device of the present invention.

Then, field insulators 8 for element isolation are formed using a conventional integrated circuit manufacturing method (FIG. 12).

Figure 13:
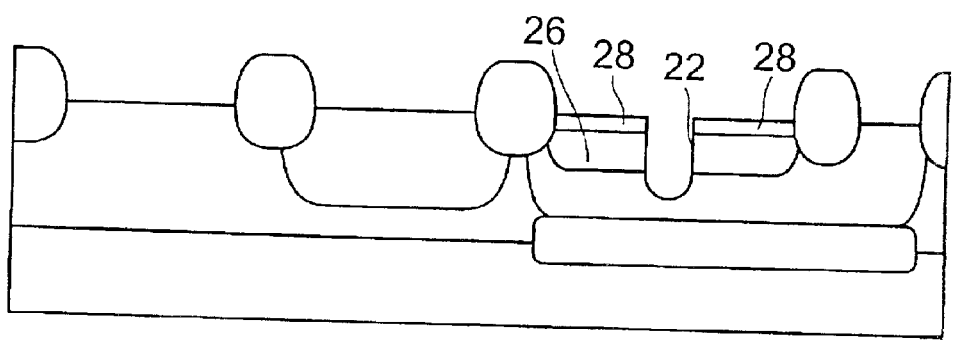
FIG. 13 is a schematic cross sectional view indicating the method of manufacturing the semiconductor integrated circuit device of the present invention.

Next, a body region for forming the channel of the P-type vertical MOSFET is formed in a region of the P-type vertical MOSFET by ion implantation of phosphorus or arsenic and high temperature thermal treatment. This condition is changed by a threshold voltage and drive power of the P-type vertical MOSFET. However, it is preferable that the body region is formed at a surface concentration of $1E16/cm^3$ to $5E17/cm^3$ and a depth of 0.5 $\mu$m to 3 $\mu$m. Next, ion implantations for controlling threshold voltages of the PMOS transistor and the NMOS transistor are separately performed for a region as the channel of a desired P-type vertical MOSFET using respective different resist masks. Then, P-type impurity implantation for forming a low concentration source region in the P-type vertical MOSFET is performed using, for example, $BF_2$ by forming another resist mask such that the surface concentration becomes the order of $1E18/cm^3$. It is required that the low concentration source region has a higher impurity concentration than that of the body region. However, when the impurity concentration is too high, a channel length in the P-type vertical MOSFET is shortened by diffusion. Thus, it is desirable that the impurity concentration is $1E18/cm^3$ to $1E19/cm^3$. However, this step is required in the case where the structure in which the gate electrode is protruded from the trench is used as in the P-type vertical MOSFET as shown in FIG. 1. On the other hand, it is not required in the case where the structure as shown in FIG. 8 in which the gate electrode is not protruded by each back is used. Then, dry etching for single crystal silicon is performed for forming a trench. This trench is formed up to a depth location equal to or deeper than the body region formed earlier. Also, a width of the trench depends on a deposition thickness of the gate electrode buried in the trench later and is set to be 0.3 $\mu$m to 1.5 $\mu$m. The width is preferably 0.4 $\mu$m to 0.6 $\mu$m (FIG. 13).

Figure 14:
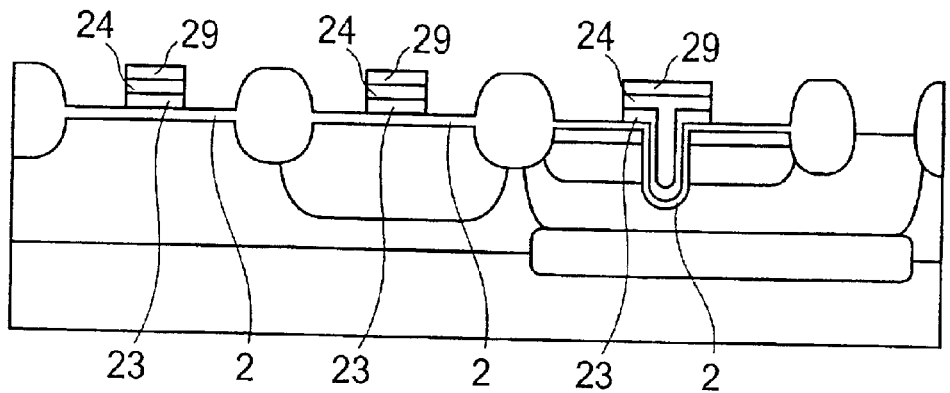
FIG. 14 is a schematic cross sectional view indicating the method of manufacturing the semiconductor integrated circuit device of the present invention.

Next, formation of a gate insulating film (made of silicon oxide) having a thickness of 10 nm to 30 nm by a thermal oxidation method, formation of a polysilicon film having a thickness of 100 nm to 500 nm by a low pressure CVD method or the like, formation of a P-type polysilicon film 28 by $B^+$ ion implantation, and formation of a tungsten silicide film 29 having a thickness of about 100 nm to 200 nm on the P-type polysilicon film 28 by sputtering method or the like are performed. At this time, the trench is completely buried by depositions of the P-type polysilicon film and the tungsten silicide film. For example, when the width of the trench is 0.5 μm, this can be achieved by forming the P-type polysilicon film having a thickness of 0.2 μm and the tungsten silicide film having a thickness of 0.2 μm. Thus, when the trench is formed at a width corresponding to 1.2 times to 1.5 times of a thickness of a desired gate electrode composed of the P-type polysilicon film and the tungsten silicide film, a laminate structure in which the gate electrode is formed in the trench as in the present invention can be realized. After that, an oxide film 30 having a thickness of about 100 nm to 300 nm is formed on the tungsten silicide film 29 by a low pressure CVD method or the like and then these films 28, 29, and 30 are patterned to form portions 16 and 17 as gate electrodes. Then, oxide films 31 are formed to have a thickness of about 10 nm to 50 nm in top side wall portions of the gate electrodes 16 and 17, a surface portion of the semiconductor substrate, and the like by using a thermal oxidation method, a low pressure CVD method, or the like (FIG. 14).

Figure 15:
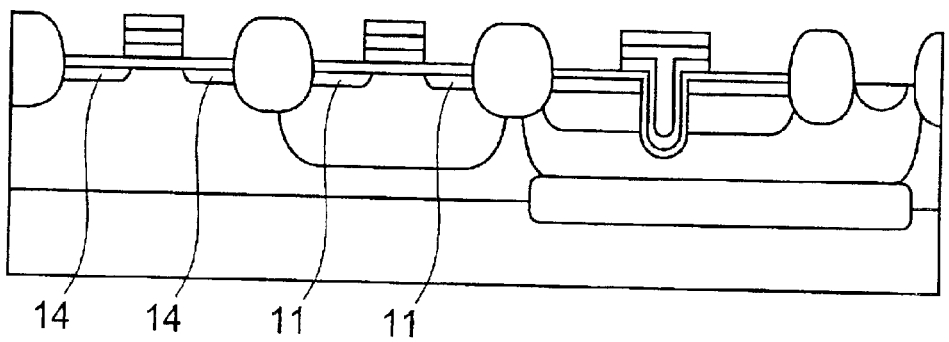
FIG. 15 is a schematic cross sectional view indicating the method of manufacturing the semiconductor integrated circuit device of the present invention.

Then, N⁻-type impurity regions 11 having an impurity concentration of about 1E18 cm³ are formed in regions as the source and the drain of the NMOS transistor using a resist mask and P⁻-type impurity regions 14 having an impurity concentration of about 1E18 cm⁻³ are formed in regions as the source and the drain of the PMOS transistor using another resist mask (FIG. 15).

Next, an oxide film is formed to have a thickness of about 300 nm to 600 nm by a CVD method or the like and then anisotropic etching is performed to form oxide film spacers 7 in side walls of the gate electrodes 16 and 17.

Figure 16:
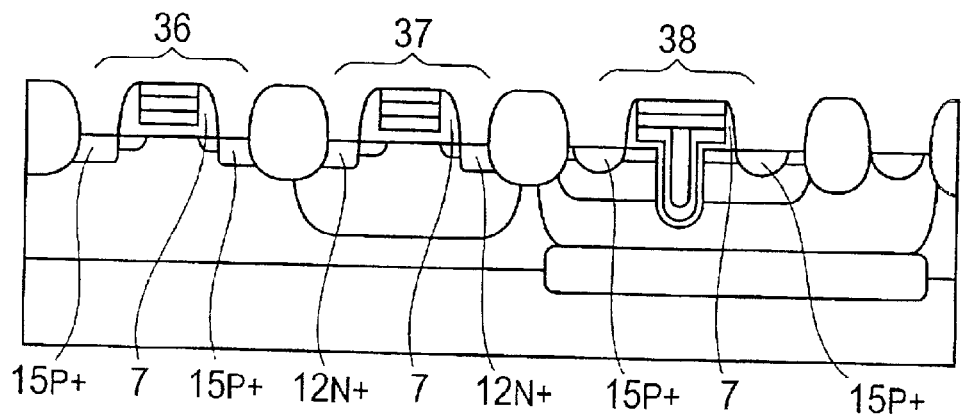
FIG. 16 is a schematic cross sectional view indicating the method of manufacturing the semiconductor integrated circuit device of the present invention.

Next, an ion implantation method is used again to form N⁺-type impurity regions 12 in regions as the source and the drain of the NMOS transistor and to form P⁺-type impurity regions 15 in regions as the source and the drain of the PMOS transistor. In the case of the N-type, phosphorus or arsenic is used as an impurity. Also, in the case of the P-type, B or BF₂ is used as an impurity. An impurity concentration of the respective impurity regions is set to be about 1E21 cm⁻³. This case includes the case where ion implantation is performed using the gate electrodes and the spacers as masks and the case where ion implantation is performed using a resist as a mask. Although not shown here, when ion implantation is performed using a resist as a mask, the oxide film spacers 7 may not be formed (FIG. 16).

Finally, although not shown, a phosphorus glass layer is formed as an interlayer insulating layer as in the case where a conventional integrated circuit is manufactured. For example, a low pressure CVD method is preferably used for forming the phosphorus glass layer. Monosilane SiH₄, oxygen O₂, and phosphine PH₃ are used as material gases and reacted at 450° C. to obtain the phosphorus glass layer.

After that, holes for electrode formation are formed in the interlayer insulating film and aluminum electrodes are formed to complete the PMOS transistor 36 and the NMOS transistor 37 as complementary MOS structures and the P-type vertical MOSFET 38.

In the case of the thus obtained MOSFET composing a complementary MOSFET device, the P-type polysilicon is used for the gate electrode. Thus, in the case of an enhancement type, the channel of the PMOS transistor is formed as a surface channel and the channel of the NMOS transistor is formed as a buried channel. The surface channel PMOS transistor has stability, reliability, and performance of the transistor characteristic superior to a conventional buried channel PMOS transistor. In particular, when a channel length is shortened, a leak current between the source and the drain can be greatly reduced and miniaturization is facilitated. Also, the P-type vertical MOSFET using the P-type polysilicon for the gate is simultaneously formed. Thus, a threshold voltage can be reduced by about 1 V as compared with the case of the N-type polysilicon gate.

In the present invention, a semiconductor integrated circuit device using a PMOS transistor as an output driver is assumed. Thus, improvement of drive power and space saving in the PMOS transistor output driver are particularly important. Therefore, with the aim of improvement of the driver power, a DMOS (double diffused MOS) transistor is employed in an element structure and a vertical structure including a trench formed in a semiconductor substrate by etching is used for space saving. Note that it is difficult to perform impurity implantation for controlling a threshold voltage in the case of the DMOS transistor. Thus, as one method of reducing a threshold voltage according to the present invention, the gate electrode of the PMOS transistor is made to be a P-type. When the performance of the NMOS transistor is also considered as the semiconductor integrated circuit, a homopolar gate technique is also one of choices. However, in a process for the vertical MOS transistor including the trench as in the present invention, a step of implanting a P-type impurity into the gate electrode is performed with leaving a step in the trench. Thus, at this stage, it is difficult to separately form a P-type impurity region and an N-type impurity region in the gate electrode using a photo resist.

In that sense, it is said that the present invention using a complete P-type gate electrode as means for realizing particularly high performance and a low cost in the semiconductor integrated circuit device using the PMOS transistor as the output driver is effective.

Figure 9:
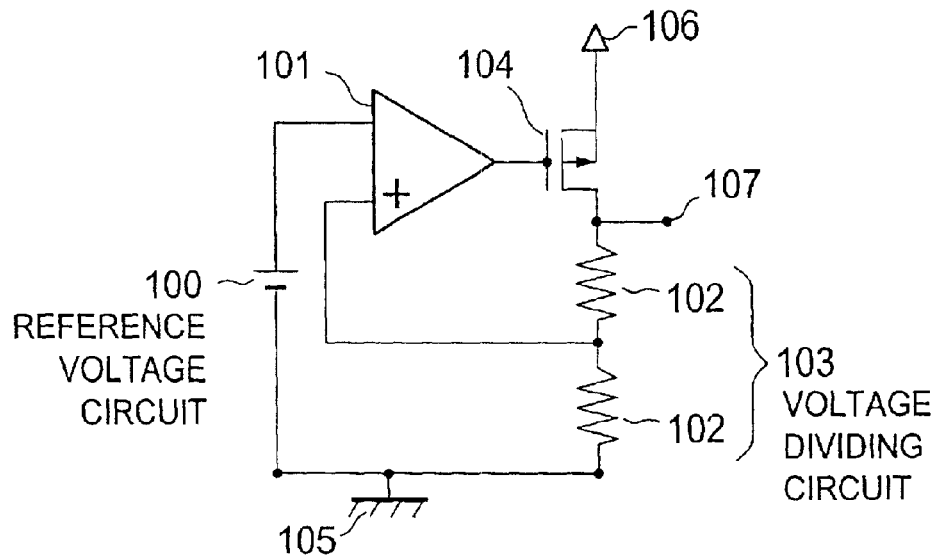
FIG. 9 shows a summary of a structure of a step-down series regulator using the semiconductor integrated circuit device of the present invention.

There is a large effect in, for example, a step-down series regulator as shown in FIG. 9, which is one of power source voltage control integrated circuits, as the semiconductor integrated circuit device in which the number of the PMOS transistors to be used is relatively larger than that of the NMOS transistors and the PMOS transistor is used as the output driver, as described above.

According to the semiconductor integrated circuit, an input voltage applied from an input terminal 106 is divided by a PMOS transistor output element 104 and a voltage dividing circuit 103 composed of resistors 102. Here, a voltage divided by the resistors 102 is inputted to a plus (+) input terminal of an error amplifier 101 and compared with a constant reference voltage produced by a reference voltage circuit 100. In accordance with the size of the comparisons, an input voltage of the PMOS transistor output element 104 is controlled by the error amplifier 101 to change a source-drain resistance of the PMOS transistor output element 104. As a result, an output terminal 107 has a function for outputting a constant output voltage corresponding to a resistance-voltage dividing ratio of the voltage dividing circuit 103. In the step-down series regulator, the PMOS transistor output element 104 is essential and it is required that the source-drain resistance of the PMOS transistor output element 104 is minimized to maximize a range of the output voltage. Thus, a large channel width is required for the PMOS transistor output element 104 and a ratio of an area occupied by the PMOS transistor output element 104 in the step-down series regulator becomes large.

Complementary MOS circuits according to the present invention having stability, reliability, and performance superior to conventional ones are used for the error amplifier 101 and the reference voltage circuit 100 and the P-type vertical MOSFET is used for the PMOS transistor output element 104. Thus, a step-down series regulator having high stability, high reliability, and realizing a low cost can be provided.

Figure 10:
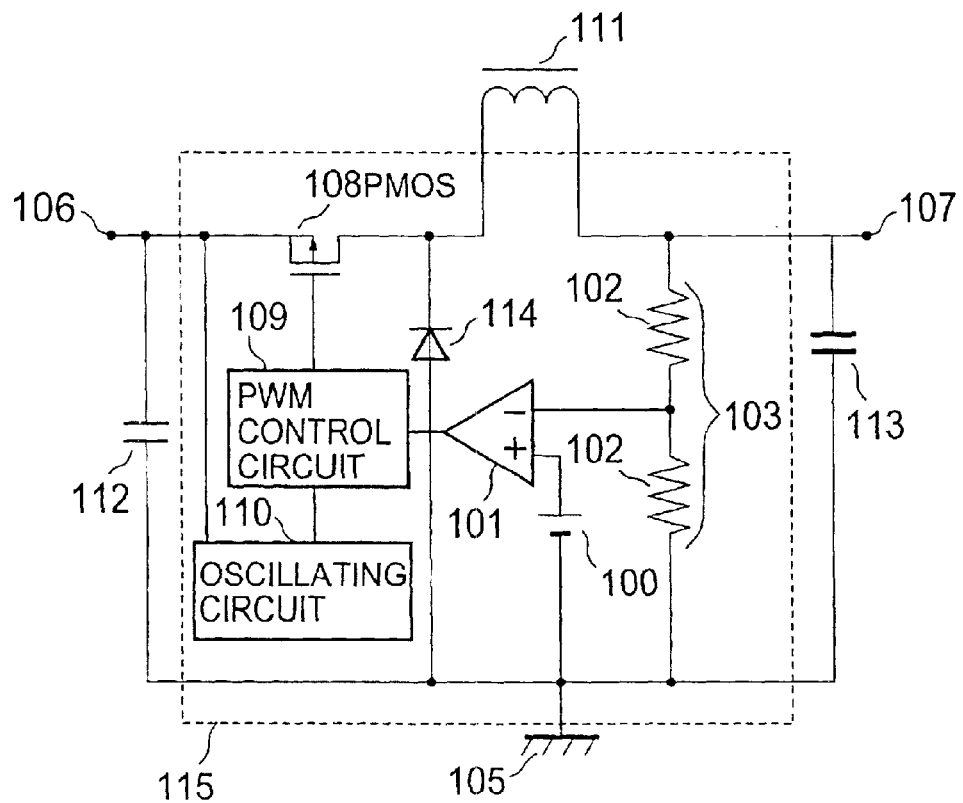
FIG. 10 shows a summary of a structure of a step-down switching regulator using the semiconductor integrated circuit device of the present invention.

Also, the present invention has a large effect in, particularly a step-down switching regulator (surrounded by a dot line in FIG. 10) which is one of power source voltage control integrated circuits. According to this semiconductor integrated circuit, an oscillation waveform is produced by an oscillating circuit 110 from an input voltage applied from an input terminal 106, shaped to be a constant voltage by a PMOS transistor switch 108, a coil 111, and a smoothing capacitor 113, and outputted from an output terminal 107. Here, a voltage obtained by dividing the output voltage by a voltage dividing circuit 103 composed of resistors 102 is inputted to an input terminal of an error amplifier 101 and compared with a constant reference voltage produced by a reference voltage circuit 100. Thus, the output voltage of the error amplifier 101 is outputted to a PWM control circuit 109. A duty ratio in the oscillation waveform produced by the oscillation circuit 110 is controlled by the PWM control circuit 109 in accordance with the output voltage of the error amplifier. That is, timing of on/off of the PMOS transistor switch 108 is changed by the PWM control circuit 109 to stabilize the output voltage.

As a result, a constant output voltage according to a voltage dividing ratio of the voltage dividing circuit 103 is outputted to the output terminal 107. Although the step-down switching regulator includes the PMOS transistor switch, it is required that the source-drain resistance of the PMOS transistor switch is minimized to suppress a reduction in voltage conversion efficiency. Thus, a large channel width is required for the PMOS transistor switch and a ratio of an area occupied by the PMOS transistor switch in the step-down switching regulator becomes large.

Complementary MOS circuits according to the present invention having stability, reliability, and performance superior to conventional ones are used for the error amplifier 101, the reference voltage circuit 100, the PWM control circuit 109, and the oscillating circuit 110 and the P-type vertical MOSFET is used for the PMOS transistor switch 108. Thus, a step-down switching regulator having high stability, high reliability, and realizing a low cost can be provided.

According to the present invention, the complementary MOS circuits and the P-type vertical MOSFET, which have stability, reliability, and performance superior to conventional ones can be formed. In particular, the present invention is effective to obtain ultra-low power of which progress in the future is considered with a short channel.

Also, in the case of a semiconductor integrated circuit device for a voltage regulator, a ratio of an area occupied by the output driver is very large. Thus, an area reduction effect (cost reduction effect) due to high drive power and miniaturization which are achieved by realizing the P-type vertical MOSFET according to the present invention is remarkable.

In the present invention, the semiconductor device of mainly a silicon system is described. However, it is apparent that the present invention can be also applied to a semiconductor device using another material such as germanium, silicon carbide, or gallium arsenide. Also, a reduction in a resistance of the gate electrode plays an important role in the present invention. However, in addition to the case of the silicon gate mainly described in the present invention, a material or the like capable of making the PMOS transistor the surface channel may be used for the gate electrode. Further, the steps of manufacturing the MOSFET on the P-type semiconductor substrate are described in this embodiment. However, it is apparent that the present invention is also applied to the case of manufacturing a thin film transistor (TFT) using a polycrystalline or single crystal semiconductor film formed on an insulating substrate made of quartz, sapphire, or the like.

What is claimed is:

1. A semiconductor integrated circuit device comprising:
   a semiconductor substrate;
   one or more horizontal MOS transistors formed in the semiconductor substrate each having a source region and a drain region arranged in a horizontal direction relative to a main surface of the semiconductor substrate and a P-type gate electrode; and
   a vertical MOS transistor formed in the semiconductor substrate and comprising a trench formed in the main surface of the semiconductor substrate, a gate insulating film covering a side surface and a bottom surface of the trench, a P-type gate electrode buried in the trench in contact with the gate insulating film, a high concentration source region formed in the main surface of the semiconductor substrate outside the trench and in contact with the trench, a body region formed in the semiconductor substrate in contact with the trench, surrounding the high concentration source region, deeper than the high concentration source region, shallower than the bottom surface of the trench and having a conductivity type opposite to that of the high concentration source region, and a high concentration drain region formed in the semiconductor substrate spaced apart from the trench, the high concentration source region, and the body region.

2. A semiconductor integrated circuit device according to claim 1; wherein the P-type gate electrode of each of the horizontal MOS transistor and the vertical MOS transistor is formed of polycrystalline silicon.

3. A semiconductor integrated circuit device according to claim 2; wherein a film thickness of the P-type gate electrodes formed of polycrystalline silicon is in the range of 2000 angstroms to 6000 angstroms.

4. A semiconductor integrated circuit device according to claim 2; wherein the polycrystalline silicon includes one of boron and $BF_2$ at an impurity concentration of $1E18/cm^3$ or higher.

5. A semiconductor integrated circuit device according to claim 1; wherein the P-type gate electrode of each of the horizontal MOS transistor and the vertical MOS transistor has a polycide structure comprised of a laminate of polycrystalline silicon and high melting point metallic suicide.

6. A semiconductor integrated circuit device according to claim 5; wherein the high melting point metallic suicide is selected from the group consisting of tungsten suicide, molybdenum suicide, titanium silicide, and platinum silicide.

7. A semiconductor integrated circuit device according to claim 1; wherein the one or more horizontal MOS transistors include a MOS transistor comprised of a low impurity concentration diffusion layer which is two-dimensionally overlapped with the P-type gate electrode and a high impurity concentration diffusion layer which is not two-dimensionally overlapped with the P-type gate electrode.

8. A semiconductor integrated circuit device according to claim 7; wherein an impurity concentration of the low impurity concentration diffusion layer is in the range of $1E16/cm^3$ to $1E18/cm^3$, and an impurity concentration of the high impurity concentration diffusion layer is $1E19/cm^3$ or higher.

9. A semiconductor integrated circuit device according to claim 1; wherein the one or more horizontal MOS transistors include an N-type MOS transistor having a low impurity concentration diffusion layer which is two-dimensionally overlapped with the P-type gate electrode and a high impurity concentration diffusion layer which is not two-dimensionally overlapped with the P-type gate electrode, an impurity of the low impurity concentration diffusion layer being one of arsenic and phosphorus and an impurity of the high impurity concentration diffusion layer being one of arsenic and phosphorus.

10. A semiconductor integrated circuit device according to claim 1; wherein the one or more horizontal MOS transistors include a P-type MOS transistor having a low impurity concentration diffusion layer which is two-dimensionally overlapped with the P-type gate electrode and a high impurity concentration diffusion layer which is not two-dimensionally overlapped with the P-type gate electrode, an impurity of the low impurity concentration diffusion layer being one of boron and $BF_2$.

11. A semiconductor integrated circuit device according to claim 1; wherein the one or more horizontal MOS transistors include a first N-type enhancement mode MOS transistor having a buried channel.

12. A semiconductor integrated circuit device according to claim 11; wherein the one or more horizontal MOS transistors include a second N-type depletion mode MOS transistor having a buried channel.

13. A semiconductor integrated circuit device according to claim 12; wherein the one or more horizontal MOS transistors include a first P-type enhancement mode MOS transistor having a surface channel.

14. A semiconductor integrated circuit device according to claim 13; wherein the one or more horizontal MOS transistors include a second P-type depletion mode MOS transistor having a buried channel.

15. A semiconductor integrated circuit device according to claim 1; wherein the gate electrode of the vertical MOS transistor is comprised of a laminated layer of P-type polycrystalline silicon and high melting point metallic silicide, the P-type polycrystalline silicon being in contact with the gate insulating film and formed in the trench so as to be surrounded by the gate insulating film, and the high melting point metallic silicide being in contact with the P-type polycrystalline silicon and buried in the trench so as to be surrounded by the gate insulating film and the P-type polycrystalline silicon.

16. A semiconductor integrated circuit device according to claim 1; wherein the vertical MOS transistor is a P-type, a conductivity type of the body region is N-type, and a conductivity type of each of the high concentration source region and the high concentration drain region is P-type.

17. A semiconductor integrated circuit device according to claim 16; wherein in the vertical MOS transistor, an impurity of the body region is one of P and As, a concentration of the impurity thereof is $1E16/cm^3$ to $5E17/cm^3$, a depth thereof is 0.5 $\mu$m to 3 $\mu$m, an impurity of each of the high concentration source region and the high concentration drain region is one of B and $BF_2$, and a concentration of the impurity thereof is $1E20/cm^3$ or higher.

18. A semiconductor integrated circuit device according to claim 17; wherein the vertical MOS transistor is formed in a P-type well layer formed in the main surface of the semiconductor substrate.

19. A semiconductor integrated circuit device according to claim 18; wherein an impurity concentration of the P-type well layer is in the range of $1E16/cm^3$ to $1E17/cm^3$.

20. A semiconductor integrated circuit device according to claim 17; wherein the vertical MOS transistor is formed on a P-type buried layer formed in an inner portion of the semiconductor substrate.

21. A semiconductor integrated circuit device according to claim 20; wherein an impurity concentration of the P-type buried layer is $1E18/cm^3$ or higher.

22. A semiconductor integrated circuit device according to claim 20; wherein an impurity concentration of the P-type buried layer is $1E20/cm^3$ or higher.

23. A semiconductor integrated circuit device according to claim 20; wherein the vertical MOS transistor is formed on the P-type buried layer formed in an inner portion of the semiconductor substrate and the P-type buried layer is surrounded by an N-type buried layer and an N-type well layer which are formed in the inner portion of the semiconductor substrate.

24. A semiconductor integrated circuit device according to claim 20; wherein the vertical MOS transistor is formed on the P-type buried layer formed in the inner portion of the semiconductor substrate and the P-type buried layer is in contact with a P-type well layer formed in the main surface of the semiconductor substrate.

25. A semiconductor integrated circuit device according to claim 1; wherein a conductivity type of the semiconductor substrate is N-type.

26. A semiconductor integrated circuit device according to claim 1; wherein a conductivity type of the semiconductor substrate is P-type and the one or more horizontal MOS transistors and the vertical MOS transistor are formed in an N-type epitaxial layer formed on the P-type semiconductor substrate.

27. A semiconductor integrated circuit device according to claim 26; wherein an impurity concentration of the P-type semiconductor substrate is $1E18/cm^3$ or higher.

28. A semiconductor integrated circuit device according to claim 27; wherein the horizontal MOS transistor is formed on an N-type buried layer formed in an inner portion of the semiconductor substrate.

29. A semiconductor integrated circuit device according to claim 27; wherein the vertical MOS transistor has a drain electrode formed on a rear surface of the P-type semiconductor substrate.

30. A semiconductor integrated circuit device according to claim 1; wherein the semiconductor integrated circuit device comprises an error amplifier, a reference voltage circuit, a PMOS transistor output element comprised of the vertical MOS transistor, a voltage dividing circuit comprised of resistors, an input terminal, and an output terminal, and wherein a source electrode of the PMOS transistor output element is connected with the input terminal, a drain electrode of the PMOS transistor output element is connected with the output terminal, an output voltage of the output terminal is divided by the voltage dividing circuit to produce a divided voltage, the divided voltage and a reference voltage output by the reference voltage circuit are input to the error amplifier to compare the two voltages, and a voltage amplified according to a difference between the two voltages is output by the error amplifier and supplied to a gate electrode of the PMOS transistor output element.

31. A semiconductor integrated circuit device according to claim 1; wherein the semiconductor integrated circuit device includes an error amplifier, a reference voltage circuit, a PMOS transistor switch, a voltage dividing circuit composed of resistors, an oscillating circuit, a PWM (pulse width modulation) control circuit, an input terminal, and an output terminal connected to the vertical MOS transistor, and wherein an output voltage of the output terminal is divided by the voltage dividing circuit to produce a divided voltage, the divided voltage and a reference voltage output by the reference voltage circuit are supplied to the error amplifier to compare the two voltages, a voltage amplified by the error amplifier according to a difference between the two voltages and a voltage output by the oscillating circuit are supplied to the PWM control circuit, a voltage output by the PWM control circuit is input to a gate electrode of the PMOS transistor switch in which a source electrode is connected with the input terminal, and a drain electrode of the PMOS transistor switch is used as a signal terminal.

32. A semiconductor integrated circuit device according to claim 1; wherein a conductivity type of the semiconductor substrate is N-type, the one or more horizontal MOS transistors comprise a P-type MOS transistor and an N-type MOS transistor, the vertical MOS transistor comprises a P-type vertical MOS transistor, and the horizontal MOS transistors and the vertical MOS transistor are formed by a method comprising:

a P-type buried layer forming step of forming a P-type buried layer in a region of the N-type semiconductor substrate in which the P-type vertical MOS transistor is to be formed;

an N-type epitaxial growth layer forming step of forming an N-type epitaxial growth layer on the N-type semiconductor substrate;

a P-type well layer forming step of forming P-type well layers in regions of the N-type epitaxial growth layer in which the N-type horizontal MOS transistor and the P-type vertical MOS transistor are to be formed;

a body region forming step of forming an N-type body region in the region of the N-type epitaxial growth layer in which the P-type vertical MOS transistor is to be formed;

a trench forming step of performing anisotropic etching toward an inner portion of the N-type semiconductor substrate to a depth that does not reach the P-type buried layer to form the trench in the region of the N-type epitaxial growth layer in which the P-type vertical MOS transistor is to be formed;

a gate insulating film forming step of forming a gate insulating film along a surface of the N-type epitaxial growth layer and the side surface of the trench;

a P-type polycrystalline silicon layer forming step of depositing a polycrystalline silicon layer on the gate insulating film and implanting a P-type impurity into the polycrystalline silicon layer by ion implantation;

a gate electrode forming step of etching the polycrystalline silicon layer to form gate electrodes on the N-type epitaxial growth layer in the trench;

a low concentration N-type region forming step of introducing an N-type impurity in a self-alignment manner using as a mask a gate electrode located on the N-type epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the N-type epitaxial growth layer and in a region in which a P-type horizontal MOS transistor is to be formed, to thereby form a low concentration P-type impurity region;

an N-type source-drain region forming step of introducing an N-type impurity into a region on the N-type epitaxial growth layer in which the N-type horizontal MOS transistor is to be formed, which is located at a predetermined distance apart from the gate electrode, to thereby form a high concentration N-type impurity region;

a P-type source-drain region forming step of introducing a P-type impurity into a region on the N-type epitaxial growth layer in which the P-type horizontal MOS transistor is to be formed, which is located at a predetermined distance apart from the gate electrode and in a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drawing regions and metallic electrode forming regions of the gate electrodes in the horizontal MOS transistors and the vertical MOS transistor; and a metallic electrode forming step of forming metallic electrodes which are connected with the gate electrodes and the source and drain regions through the contact holes.

33. A semiconductor integrated circuit device according to claim 1; wherein a conductivity type of the semiconductor substrate is N-type, the one or more horizontal MOS transistors comprise a P-type MOS transistor and an N-type MOS transistor, the vertical MOS transistor comprises a P-type vertical MOS transistor, and the horizontal MOS transistors and the vertical MOS transistor are formed by a method comprising:

a P-type well layer forming step of forming P-type well layers in regions of the N-type semiconductor substrate in which the N-type horizontal MOS transistor and the P-type vertical MOS transistor are to be formed;

a body region forming step of forming an N-type body region in a region which located on the N-type semiconductor substrate in which the P-type vertical MOS transistor is to be formed;

a trench forming step of performing anisotropic etching toward an inner portion of the N-type semiconductor substrate to a depth that does not exceed a depth of the P-type well layer to form the trench in a region located on the N-type semiconductor substrate in which the P-type vertical MOS transistor is to be formed;

a gate insulating film forming step of forming a gate insulating film along the surface of the N-type semiconductor substrate and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type semiconductor substrate and in the trench;

a low concentration N-type region forming step of introducing an N-type impurity in a self-alignment manner using as a mask a gate electrode located on the N-type semiconductor substrate in the region in which the N-type horizontal NOS transistor is to be formed, to thereby form a low concentration N-type impurity region;

a low concentration P-type region forming step of introducing a P-type impurity in a self-alignment manner using as a mask a gate electrode located on the N-type semiconductor substrate in a region in which a P-type horizontal MOS transistor is to be formed, to thereby form a low concentration P-type impurity region;

an N-type source-drain region forming step of introducing an N-type impurity into a region of the N-type semiconductor substrate in which the N-type horizontal MOS transistor is to be formed, which is located at a predetermined distance apart from the gate electrode, to thereby form a high concentration N-type impurity region;

a P-type source-drain region forming step of introducing a P-type impurity into a region of the N-type semiconductor substrate in which the P-type horizontal MOS transistor is to be formed, which is located at a predetermined distance apart from the gate electrode and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes in the horizontal MOS transistors and the vertical MOS transistor; and a metallic electrode forming step of forming metallic electrodes which are connected with the gate electrodes and the source and drain regions through the contact holes.

34. A semiconductor integrated circuit device according to claim 1; wherein a conductivity type of the semiconductor substrate is N-type, the one or more horizontal MOS transistors comprise a P-type MOS transistor and an N-type MOS transistor, the vertical MOS transistor comprises a P-type MOS transistor, and the horizontal MOS transistors and the vertical MOS transistor are formed by a method comprising:

a P-type buried layer forming step of forming a P-type buried layer in a region of the N-type semiconductor substrate in which the P-type vertical MOS transistor is to be formed;

an N-type buried layer forming step of forming N-type buried layers in regions located in the surface of the N-type semiconductor substrate in which the horizontal MOS transistors are to be formed;

a P-type epitaxial growth layer forming step of forming a P-type epitaxial growth layer on the N-type semiconductor substrate;

an N-type well layer forming step of forming N-type well layers to a depth which reaches the N-type buried layer in a vicinity of a region in which the P-type horizontal MOS transistor is to be formed, a vicinity of a region in which the N-type horizontal MOS transistor is to be formed, and a vicinity of the region in which the P-type vertical MOS transistor is to be formed, the regions being located in the P-type epitaxial growth layer;

a body region forming step of forming an N-type body region in a region of the P-type epitaxial growth layer in which the P-type vertical MOS transistor is to be formed;

a trench forming step of performing anisotropic etching toward an inner portion of the N-type semiconductor substrate to a depth that does not reach the P-type buried layer to form the trench in a region of the P-type epitaxial growth layer at which the P-type vertical MOS transistor is to be formed;

a gate insulating film forming step of forming a gate insulating film along a surface of the P-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the P-type epitaxial growth layer in the trench;

a low concentration N-type region forming step of introducing an N-type impurity in a self-alignment manner using as a mask a gate electrode located on the P-type epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the P-type epitaxial grown layer in a region in which the P-type horizontal MOS transistor is to be formed, to thereby form a low concentration P-type impurity region;

an N-type source-drain region forming step of introducing an N-type impurity into a region of the P-type epitaxial growth layer in which the N-type horizontal MOS transistor is to be formed which is located at a predetermined distance apart from the gate electrode, to thereby form a high concentration N-type impurity region;

a P-type source-drain region forming step of introducing a P-type impurity into a region of the P-type epitaxial growth layer which is located at a predetermined distance apart from the gate electrode and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and rain regions and metallic electrode forming regions of the gate electrodes in the horizontal MOS transistors and the vertical MOS transistor; and a metallic electrode forming step of forming metallic electrodes which are connected with the gate electrodes and the source and drain regions through the contact holes.

35. A semiconductor integrated circuit device according to claim 1; wherein a conductivity type of the semiconductor substrate is P-type with a high impurity concentration, the one or more horizontal MOS transistors comprise a P-type MOS transistor and an N-type MOS transistor, the vertical MOS transistor comprises a P-type MOS transistor, and the horizontal MOS transistors and the vertical MOS transistor are formed by a method comprising:

an N-type buried layer forming step of forming N-type buried layers in regions of the high impurity concentration P-type semiconductor substrate in which the horizontal MOS transistors are to be formed;

an N-type epitaxial growth layer forming step of forming an N-type epitaxial growth layer on the high concentration P-type semiconductor substrate;

a P-type well layer forming step of forming P-type well layers in regions of the N-type epitaxial growth layer in which the P-type vertical MOS transistor is to be formed and in which the N-type horizontal MOS transistor and the P-type vertical MOS transistor are to be formed, the P-type well layer in the region in which the P-type vertical MOS transistor is to be formed being formed to a depth which reaches the high concentration P-type semiconductor substrate;

an N-type well layer forming step of forming N-type well layers in the region in which the P-type horizontal MOS transistor is to be formed and in a vicinity of the region in which the P-type vertical MOS transistor is to be formed to a depth which reaches the N-type buried layer, the regions being located in the P-type epitaxial growth layer;

a body region forming step of forming an N-type body region in a region of the N-type epitaxial growth layer in which the P-type vertical MOS transistor is to be formed;

a trench forming step of performing anisotropic etching toward an inner portion of the semiconductor substrate to a depth which does not reach the high concentration P-type semiconductor substrate, to thereby form a trench in a region of the N-type epitaxial growth layer in which the P-type vertical MOS transistor is to be formed;

a gate insulating film forming step of forming a gate insulating film along a surface of the N-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type epitaxial growth layer in the trench;

a low concentration N-type region forming step of introducing an N-type impurity in a self-alignment manner using as a mask a gate electrode located on the epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the epitaxial growth layer in a region in which the P-type horizontal MOS transistor is to be formed, to thereby form a low concentration P-type impurity region;

an N-type source-drain region forming step of introducing an N-type impurity into a region of the N-type epitaxial growth layer in which the N-type horizontal MOS transistor is to be formed, which is located at a predetermined distance apart form the gate electrode, to thereby form a high concentration N-type impurity region;

a P-type source-drain region forming step of introducing a P-type impurity into a region of the N-type epitaxial growth layer in which the P-type horizontal MOS transistor is to be formed, which is located at a predetermined distance apart form the gate electrode, and into a region in which the P-type vertical MOS transistor is to be formed and which is in contact with the trench, to thereby form a high concentration P-type impurity region; p1 an intermediate insulating film depositing step of depositing an intermediate insulating film on the gate electrodes;

a contact hole forming step of forming contact holes in the intermediate insulating film located on source and drain regions of the horizontal MOS transistors, in the intermediate insulating film located on a source region of the P-type vertical MOS transistor, and in metallic electrode forming regions of the gate electrodes;

a metallic electrode forming step of forming metallic electrodes in the gate electrodes and the source and drain regions through the contact holes; and a vertical MOS transistor drain metallic electrode forming step of forming a drain metallic electrode of the P-type vertical MOS transistor on a rear surface of the high concentration P-type semiconductor substrate.

36. A semiconductor integrated circuit device according to claim 1; wherein a conductivity type of the semiconductor substrate is N-type, the one or more horizontal MOS transistors comprise a P-type MOS transistor and an N-type MOS transistor, the vertical MOS transistor comprises a P-type vertical MOS transistor, and the horizontal MOS transistors and the vertical MOS transistor are formed by a method comprising:

a P-type buried layer forming step of forming a P-type buried layer in a region of the N-type semiconductor substrate and in which the P-type vertical MOS transistor is to be formed;

an N-type epitaxial growth layer forming step of forming an N-type epitaxial growth layer on the N-type semiconductor substrate;

a P-type well layer forming step of forming P-type well layers in regions of the N-type epitaxial growth layer in which the N-type horizontal MOS transistor and the P-type vertical MOS transistor are to be formed;

a body region forming step of forming an N-type body region in a region of the N-type epitaxial growth layer in which the P-type vertical MOS transistor is to be formed;

a P-type low concentration source region forming step of forming a P-type low concentration source region in the region of the N-type epitaxial growth layer in which the P-type vertical MOS transistor is to be formed;

a trench forming step of forming anisotropic etching toward an inner portion of the semiconductor substrate up to a depth that a trench does not reach the P-type buried layer, to thereby form a trench in a region of the N-type epitaxial growth layer in which the P-type vertical MOS transistor is to be formed;

a gate insulating film forming step of forming a gate insulating film along a surface of the N-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type epitaxial growth layer in the trench;

a low concentration N-type region forming step of introducing an N-type impurity in a self-alignment manner using as a mask a gate electrode located on the epitaxial growth layer in a region in which the N-type horizontal MOS transistor is to be formed, to thereby form a low concentration N-type impurity region;

a low concentration P-type region forming step of introducing a P-type impurity in a self-alignment manner using as a mask a gate electrode located on the epitaxial growth layer in a region in which a P-type horizontal MOS transistor is to be formed, to thereby form a low concentration P-type impurity region;

an N-type source-drain region forming step of introducing an N-type impurity into a region of the N-type epitaxial growth layer in which the N-type horizontal MOS transistor is to be formed, which is located at a predetermined distance apart from the gate electrode, to thereby form a high concentration N-type impurity region;

a P-type source-drain region forming step of introducing a P-type impurity into a region of the N-type epitaxial growth layer in which the P-type horizontal MOS transistor is to be formed, which is located at a predetermined distance apart from the gate electrode, and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes of the horizontal MOS transistors and the P-type vertical MOS transistor; and a metallic electrode forming step of forming metallic electrodes in the gate electrodes and the source and drain regions through the contact holes.

37. A semiconductor integrated circuit device according to claim 1; wherein a conductivity type of the semiconductor substrate is N-type, the one or more horizontal MOS transistors comprise a P-type MOS transistor and an N-type MOS transistor, the vertical MOS transistor comprises a P-type vertical MOS transistor, and the horizontal MOS transistors and the vertical MOS transistor are formed by a method comprising:

a P-type well layer forming step of forming P-type well layers in regions of the N-type semiconductor substrate in which the N-type horizontal MOS transistor and the P-type vertical MOS transistor are to be formed;

a body region forming step of forming an N-type body region in a region of the semiconductor substrate in which the P-type vertical MOS transistor is to be formed;

a P-type low concentration source region forming step of forming a P-type low concentration source region in a region of the semiconductor substrate in which the P-type vertical MOS transistor is to be formed;

a trench forming step of performing anisotropic etching toward an inner portion of the semiconductor substrate to a depth which does not exceed a depth of the P-type well layer, to thereby form the trench in a region of the N-type semiconductor substrate in which the P-type vertical MOS transistor is to be formed;

a gate insulating film forming step of forming a gate insulating film along the main surface of the semiconductor substrate and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the semiconductor substrate and in the trench;

a low concentration N-type region forming step of introducing an N-type impurity in a self-alignment manner using as a mask a gate electrode located on the semiconductor substrate in a region in which the N-type horizontal MOS transistor is to be formed, to thereby form a low concentration N-type impurity region;

a low concentration P-type region forming step of introducing a P-type impurity in a self-alignment manner using as a mask a gate electrode located on the semiconductor substrate in a region in which the P-type horizontal MOS transistor is to be formed, to thereby form a low concentration P-type impurity region;

an N-type source-drain region forming step of introducing an N-type impurity into a region of the N-type semiconductor substrate in which the N-type horizontal MOS transistor is to be formed, which is located at a predetermined distance apart from the gate electrode, to thereby form a high concentration N-type impurity region;

a P-type source-drain region forming step of introducing a P-type impurity into a region of the N-type semiconductor substrate in which the P-type horizontal MOS transistor is to be formed, which is located at a predetermined distance apart from the gate electrode, and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions and metallic electrode forming regions of the gate electrodes in the horizontal MOS transistors and the P-type vertical MOS transistor; and a metallic electrode forming step of forming metallic electrodes which are connected with the gate electrodes and the source and drain regions through the contact holes.

38. A semiconductor integrated circuit device according to claim 1; wherein a conductivity type of the semiconductor substrate is N-type, the one or more horizontal MOS transistors comprise a P-type MOS transistor and an N-type MOS transistor, the vertical MOS transistor comprises a P-type MOS transistor, and the horizontal MOS transistors and the vertical MOS transistor are formed by a method comprising:

a P-type buried layer forming step of forming a P-type buried layer in a region of the N-type semiconductor substrate in which the P-type vertical MOS transistor is to be formed;

an N-type buried layer forming step of forming N-type buried layers in regions of the N-type semiconductor substrate in which the horizontal MOS transistors are to be formed;

a P-type epitaxial growth layer forming step of forming a P-type epitaxial growth layer on the N-type semiconductor substrate;

an N-type well layer forming step of forming N-type well layers to a depth which reaches the N-type buried layer, in a region in which the P-type horizontal MOS transistor is to be formed, in a vicinity of a region in which the N-type horizontal MOS transistor is to be formed, and a vicinity of a region in which the P-type vertical MOS transistor is to be formed, the regions being located in the P-type epitaxial growth layer;

a body region forming step of forming an N-type body region in a region of the P-type epitaxial growth layer in which the P-type vertical MOS transistor is to be formed;

a trench forming step of performing anisotropic etching toward an inner portion of the N-type semiconductor substrate to a depth which does not reach the P-type buried layer to form the trench in the P-type epitaxial growth layer in a region in which the P-type vertical MOS transistor is to be formed;

a gate insulating film forming step of forming a gate insulating film along a surface of the P-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the P-type epitaxial growth layer in the trench;

a low concentration N-type region forming step of introducing an N-type impurity in a self-alignment manner using as a mask a gate electrode located on the P-type epitaxial growth layer in the region in which the N-type horizontal MOS transistor is to be formed, to thereby form a low concentration N-type impurity region;

a low concentration P-type region forming step of introducing a P-type impurity in a self-alignment manner using as a mask a gate electrode located on the P-type epitaxial growth layer in a region in which the P-type horizontal MOS transistor is to be formed, to thereby form a low concentration P-type impurity region;

an N-type source-drain region forming step of introducing an N-type impurity into a region on the P-type epitaxial growth layer in which the N-type horizontal MOS transistor is to be formed, which is located at a predetermined distance apart from the gate electrode, to thereby form a high concentration N-type impurity region;

a P-type source-drain region forming step of introducing a P-type impurity into a region of the P-type epitaxial growth layer in which the P-type horizontal MOS transistor is to be formed, which is located at a predetermined distance apart from the gate electrode. and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source-drain regions of the horizontal MOS transistors and the P-type vertical MOS transistor, and in regions in which metallic electrodes are to be formed; and a metallic electrode forming step of forming metallic electrodes provided to the gate electrodes and the source and drain regions through the contact holes.

39. A semiconductor integrated circuit device according to claim 1; wherein a conductivity type of the semiconductor substrate is P-type at a high impurity concentration, the one or more horizontal MOS transistors comprise a P-type MOS transistor and an N-type MOS transistor, the vertical MOS transistor comprises a P-type vertical MOS transistor, and the horizontal MOS transistors and the vertical MOS transistor are formed by a method comprising:

an N-type buried layer forming step of forming N-type buried layers in regions of the high concentration P-type semiconductor substrate in which the horizontal MOS transistors are to be formed;

an N-type epitaxial growth layer forming step of forming an N-type epitaxial growth layer on the high concentration P-type semiconductor substrate;

a P-type well layer forming step of forming P-type well layers in regions of the N-type epitaxial growth layer in which the N-type horizontal NOS transistor and the P-type vertical MOS transistor are to be formed, and up to a depth at which the P-type well layer reaches the high concentration P-type semiconductor substrate in the region in which the P-type vertical MOS transistor is to be formed;

an N-type well layer forming step of forming N-type well layers up to a depth reaches the N-type buried layer in the region in which the P-type horizontal MOS transistor is to be formed and in a vicinity of the region in which the P-type vertical MOS transistor is to be formed, the regions being located in the N-type epitaxial growth layer;

a body region forming step of forming an N-type body region in a region of the N-type epitaxial growth layer in which the P-type vertical MOS transistor is to be formed;

a P-type low concentration source region forming step of forming a P-type low concentration source region in a region of the N-type epitaxial growth layer in which the P-type vertical MOS transistor is to be formed;

a trench forming step of performing anisotropic etching toward an inner portion of the high concentration P-type semiconductor substrate up to a depth at which a trench does not reach the high concentration P-type semiconductor substrate to form the trench in a region of the N-type epitaxial growth layer in which the P-type vertical MOS transistor is to be formed;

a gate insulating film forming step of forming a gate insulating film along a surface of the N-type epitaxial growth layer and a side surface of the trench;

a P-type polycrystalline silicon layer forming step of depositing a polycrystalline silicon layer on the gate insulating film and implanting a P-type impurity into the polycrystalline silicon layer by an ion implantation method;

a gate electrode forming step of etching the polycrystalline silicon layer to form gate electrodes on the N-type epitaxial growth layer in the trench;

a low concentration N-type region forming step of introducing an N-type impurity in a self-alignment manner using as a mask a gate electrode located on the N-type epitaxial growth layer in a region in which the N-type horizontal MOS transistor is to be formed, to thereby form a low concentration N-type impurity region;

a low concentration P-type region forming step of introducing a P-type impurity in a self-alignment manner using as a mask a gate electrode located on the N-type epitaxial growth layer in a region in which the P-type horizontal MOS transistor is to be formed, to thereby form a low concentration P-type impurity region;

an N-type source-drain region forming step of introducing an N-type impurity into a region of the epitaxial growth layer in which the N-type horizontal MOS transistor is to be formed, which is located at a predetermined distance apart form the gate electrode, to thereby form a high concentration N-type impurity region;

a P-type source-drain region forming step of introducing a P-type impurity into a region of the epitaxial growth layer in which the P-type horizontal MOS transistor is to be formed, which is located at a predetermined distance apart from the gate electrode, and into a region in which the P-type vertical MOS transistor is to be formed, which is located at a predetermined distance apart from the gate electrode, and into a region in which the P-type vertical MOS transistor is to be formed and which is in contact with the trench, to thereby form a high concentration P-type impurity region;

an intermediate insulating film depositing step of depositing an intermediate insulating film on the gate electrodes;

a contact hole forming step of forming contact holes in the intermediate insulating film located on source and drain regions of the horizontal MOS transistors, in the intermediate insulating film located on a source region of the P-type vertical MOS transistors, in the intermediate insulating film located on a source region of the P-type vertical MOS transistor, and in metallic electrode forming regions of the gate electrodes;

a metallic electrode forming step of forming metallic electrodes in the gate electrodes and the source and drain regions through the contact holes; and a vertical MOS transistor drain metallic electrode forming step of forming a drain metallic electrode of the P-type vertical MOS transistor on a rear surface of the high concentration P-type semiconductor substrate.

40. A semiconductor integrated circuit device comprising:

a semiconductor substrate;

one or more horizontal MOS transistors formed in the semiconductor substrate each having a source region and a drain region arranged in a horizontal direction relative to a main surface of the semiconductor substrate and a P-type gate electrode; and a vertical MOS transistor formed in the semiconductor substrate and comprising a trench formed in the main surface of the semiconductor substrate, a gate insulating film covering a side surface and a bottom surface of the trench, a P-type gate electrode in contact with the gate insulating film, formed on the main surface of the semiconductor substrate around the concave portion, and buried in the trench, a low concentration source region in contact with the trench and formed under the gate electrode in the main surface of the semiconductor substrate, a high concentration source region spaced apart from the trench, in contact with the low concentration source region, and formed in the main surface of the semiconductor substrate outside the gate electrode, a body region in contact with the concave portion, surrounding the high concentration source region and the low concentration source region, formed to be deeper than the low concentration source region and the high concentration source region and shallower than the bottom surface of the trench, and having a conductivity type opposite to the low concentration source region and the high concentration source region, and a high concentration drain region spaced apart from the trench, the low concentration source region, the high concentration source region, and the body region and formed in the main surface of the semiconductor substrate.

41. A semiconductor integrated circuit device according to claim 40; wherein in the vertical MOS transistor, a portion of the gate electrode in the trench is formed of P-type polycrystalline silicon and high melting point metallic suicide, the P-type polycrystalline silicon being in contact with the gate insulating film and formed in the trench so as to be surrounded by the gate insulating film, the high melting point metallic suicide being in contact with the P-type polycrystalline silicon and buried in the trench so as to be surrounded by the gate insulating film and the P-type polycrystalline silicon, and a portion of the gate electrode on the main surface of the semiconductor substrate having a polycide structure composed of a laminate of polycrystalline silicon and high melting point metallic silicide.

42. A semiconductor integrated circuit device according to claim 41; wherein an impurity concentration of the low concentration source region in the vertical MOS transistor is $1E18/cm^3$ to $1E19/cm^3$.

* * * * *